(12) United States Patent
Mizutani et al.

(10) Patent No.: US 6,184,972 B1
(45) Date of Patent: Feb. 6, 2001

(54) SUBSTRATE TRANSPORT APPARATUS, SUBSTRATE HOLDING APPARATUS AND SUBSTRATE PROCESSING APPARATUS

(75) Inventors: Shinji Mizutani, Nagoya; Hiroaki Narusima, Tokyo, both of (JP)

(73) Assignee: Nikon Corporation, Tokyo (JP)

( * ) Notice: Under 35 U.S.C. 154(b), the term of this patent shall be extended for 0 days.

(21) Appl. No.: 09/395,602

(22) Filed: Sep. 14, 1999

(30) Foreign Application Priority Data

Sep. 18, 1998 (JP) .................................................. 10-265343

(51) Int. Cl.[7] ........................... G03B 27/58; G03B 27/42; G03B 27/02; G03B 11/00; G03B 1/24
(52) U.S. Cl. ............................. 355/72; 355/53; 355/74; 355/73; 355/78; 269/21; 269/286; 269/903
(58) Field of Search ..................... 355/53, 72, 73, 355/78, 74; 269/21, 286, 903

(56) References Cited

U.S. PATENT DOCUMENTS

| | | | |
|---|---|---|---|
| 3,711,081 | * | 1/1973 | Cachon .................................. 269/21 |
| 3,833,230 | * | 9/1974 | Noll ........................................ 279/3 |
| 4,522,489 | | 6/1985 | Bouwer . |
| 4,869,481 | | 9/1989 | Yabu et al. . |
| 5,324,012 | | 6/1994 | Aoyama et al. . |
| 5,423,558 | * | 6/1995 | Koeth et al. ............................... 279/3 |
| 5,473,410 | | 12/1995 | Nishi . |
| 5,563,683 | | 10/1996 | Kamiya . |
| 5,793,474 | | 8/1998 | Nishi . |
| 5,835,195 | * | 11/1998 | Gibson et al. ........................... 355/53 |
| 5,923,915 | * | 7/1999 | Akimoto et al. ......................... 355/53 |

FOREIGN PATENT DOCUMENTS

| | | |
|---|---|---|
| 1-214042 | 8/1989 | (JP) . |
| 7-240366 | 9/1995 | (JP) . |
| 7-288276 | 10/1995 | (JP) . |
| 8-031515 | 2/1996 | (JP) . |

* cited by examiner

Primary Examiner—Russell Adams
Assistant Examiner—Khaled Brown
(74) Attorney, Agent, or Firm—Oliff & Berridge, PLC

(57) ABSTRACT

Spoke shaped (petal shaped) through holes or cavities are provided at the center or a substrate holder which attaches and holds a substrate over substantially the entire surface, to allow vertical movement of a center-up member having a plurality of radially extended spoke shaped mounting portions. As a result, degradation in the flatness of a substrate at the time of attaching the substrate to the mounting surface of the substrate holder is minimized.

19 Claims, 13 Drawing Sheets

ODD NUMBER ARRANGEMENT SHOT REGION

EVEN NUMBER ARRANGEMENT SHOT REGION

SUBSTRATE TRANSPORT APPARATUS, SUBSTRATE HOLDING APPARATUS AND SUBSTRATE PROCESSING APPARATUS

BACKGROUND OF THE INVENTION

1. Field of the Invention

The present invention relates to an apparatus for transporting substrates such as circular semiconductor wafers, rectangular glass plates, masks or the like, used in processes for manufacturing electronic circuit devices such as semiconductor devices or liquid crystal devices, and to a substrate holding apparatus which is required accompanying such transport.

2. Disclosure of the Related Art

Heretofore, of these types of substrate transport apparatus, with a transport mechanism which is mounted on a precision exposure apparatus used in a photolithography process (lithography involving painting-exposing-developing a photosensitive solution on a substrate), one substrate has been taken out from a carrier or an inline substrate stock section which stores several substrates (wafers or glass plates) to be subjected to exposure processing, and this has been automatically transported to a pre-alignment section by means of an articulated type robot arm or the like, to be further moved while being held at a desired pre-alignment accuracy on a vacuum attachment holder on a substrate stage in an exposure apparatus.

In the case of such a precision exposure apparatus, the vacuum attachment type substrate holder has the principal function of correcting the surface of the substrate to an extremely flat condition, so that the transfer image of the mask pattern to be exposed is formed on the exposure surface (reticle surface) of the substrate at a desired image quality (resolution, and degree of film reduction of the photosensitive layer etc.). Consequently, the mounting surface for the substrate holder is finished to an extremely flat surface of for example ±0.2 μm. Recently, this type of substrate holder is made with a ceramic mother material, by depositing on the surface using a CVD method, a thin film exhibiting good electroconductivity (for example a layer of silicon carbide, titanium carbide or the like of a thickness of approximately 300 μm) and then forming grooves for suction attachment in the thin film layer by mechanical cutting, or by optical polishing over the entire surface.

The reason for the high degree of flatness of the substrate holder is attributable to the decrease in the depth of focus originating in conjunction with the year by year increase in the resolving power of projection exposure apparatus, which constitute the main stream as precision exposure apparatus. That is, this is because when the depth of focus of the projection exposure apparatus becomes small, there is also the requirement for a high degree of flatness (local flatness) at the local region of the substrate surface corresponding to inside the projection field of the projection optical system.

Consequently, in particular with the projection type exposure apparatus, it is necessary to sufficiently maintain the accuracy of the flatness correction of the substrate by the substrate holder. Therefore it is desirable to obtain a uniform attachment force on the rear face of the substrate over the entire mounting surface of the substrate holder. However, here the uniform attachment force does not necessarily mean that the entire substrate rear face provides vacuum attachment, but has the meaning that even in the case of vacuum attachment partially at a plurality of attachment grooves or the like, localized on the rear face of the substrate, if a desired degree of flatness is maintained considering the original shape and slight warping of the substrate, then with that, a uniform attachment force is obtained.

On the other hand, considered from the substrate transport mechanism side, if the construction is such that the transport arm contacts and holds the upper face of the substrate, then it is possible to place the substrate on the mounting face of the substrate holder, and remove a substrate which is attached to the mounting face. However here, in handling the substrate, since the upper face which is painted with the resist layer becomes the device forming face, then having the transport arm attached to and holding the upper face of the substrate becomes undesirable from the point of attachment of dust and dirt, or damage to the device forming surface.

Therefore, for the conventional substrate transport apparatus, there is known an apparatus as shown for example in Japanese Unexamined Patent Application, First Publication No. Hei 1-214042, which is provided with a vertically movable center-up portion (or three support members) located at a central portion of a substrate holder (or at three locations substantially equally displaced from the center of the holder) for lifting the substrate by a fixed amount from the holder mounting surface and supporting the substrate when the substrate is to be transported, and by inserting a transport arm into a space between the lifted substrate and the holder mounting surface, the transport arm can attach to and hold the rear face of the substrate.

Of the conventional wafer transport mechanisms disclosed in Japanese Unexamined Patent Application, First Publication No. Hei 1-214042, in particular the transport mechanism provided with the vertically movable center-up portion at the central portion of the substrate holder, which adopts the system of supporting the rear face of the substrate on the upper end face of center-up portion by vacuum attachment and raises and lowers the substrate, is mounted onto a reduction projection type exposure apparatus NSR-1010G or NSR-1505G distributed by Nikon Company Limited in 1981 through 1983.

However, with the conventional apparatus, there is the problem that this can no longer necessarily and sufficiently cope with transporting and holding substrates which are becoming larger year by year. For example, in the production area of semiconductor circuit devices such as VLSI and ULSI, a production line for forming a pattern for a device chip on a semiconductor wafer of 300 mm diameter (previously 200 mm), has been introduced, with the requirement for safe and accurate transport of such large wafers, or stable retention thereof.

As indicated with the above conventional wafer transport mechanism, in the case where a cylindrical center-up section is only provided at the central portion of the substrate holder, then in order to stably and accurately hold a 300 mm diameter wafer at the central portion, the diameter of the upper end face of the center-up portion must be made greater than 30 mm (that is, greater than approximately 10% of the wafer diameter). Therefore, a large circular opening portion of more than 30 mm diameter must also formed in the central portion of the substrate holder for taking the center-up portion.

If in this way a large circular opening portion is formed in the central portion of the substrate holder, then on the rear face portion of a wafer mounted thereon, then naturally, there can be no holder upper end face (mounting face) for contact at the central portion, and hence flatness correction cannot be performed to sufficient accuracy, so that the problem of a deterioration in the local flatness arises.

On the other hand, in the case where three vertically movable support members are provided as illustrated for the conventional wafer transport mechanism, and apertures for respectively taking the three support members are formed at three locations in the substrate holder, if the positional spacing of the three support members is changed corresponding to the enlargement of the wafer, that is to say the positional spacing of the apertures at three locations on the substrate holder is changed, then it is considered possible to deal with the enlargement of the wafer without specially enlarging the diameters of the respective apertures.

However, even with three support members, if the diameters of the upper end portions of the respective support members remain as heretofore, the problem arises in accurate transport (delivery to the arm). This is because, if the diameter of the upper end face of the respective support members is small (for example around 4 mm), then the vacuum attachment force at the time of lifting and holding the wafer is insufficient so that at the time of wafer delivery between the transport arms, positional deviation of the wafer occurs (at worst around several hundred microns). This positional deviation is a serious problem, particularly in the loading of the unexposed wafer inside the exposure apparatus.

With the normal exposure apparatus, a fine alignment operation is performed by moving the wafer stage in the X-Y-direction with the wafer positioning accuracy set by a pre-alignment mechanism as a base, and positioning an alignment mark formed within a region of several 10s of microns on the wafer beneath an alignment microscope. Consequently, if during transport and delivery of the wafer onto the substrate holder of the wafer stage from the pre-alignment mechanism, a positional deviation occurs which excessively exceeds the positioning accuracy by the pre-alignment, then it is not possible to detect the alignment mark for the fine alignment operation.

In this case, with the exposure apparatus, due to error processing, subsequent operations are stopped, the exposure processing for that wafer is cancelled and the wafer returned to the standby position (for example the pre-alignment mechanism) and then forcefully transferred to the carry out position (for example the unload cassette). Therefore the processing throughput of the exposure apparatus drops.

DISCLOSURE OF THE INVENTION

Accordingly, it is an object of the present invention to provide a transport apparatus whereby stable substrate transport is possible by accurate delivery even with large size substrates to be processed, and to provide a holding apparatus which can hold such large substrates stably and with good flatness. Moreover, it is an object to provide a substrate processing apparatus on which is mounted such a transport apparatus and holding apparatus.

Therefore, a first aspect according to the present invention, is applied to a transport apparatus provided with: a first holding member (substrate holder) having a mounting face with substantially the same shape as that of a substrate to be processed, for supporting a substrate on said mounting face, a second holding member (center-up member) for holding a rear face of a substrate, which projects from one portion of the mounting face of the first holding member at a time of transporting the substrate, in order to hold the substrate in an upper side space of the mounting face of the first holding member, and a transport arm member for moving a substrate between at least one of a standby position and a carry out position, and the upper side space of the first holding member in order to transport the substrate from a predetermined standby position (for example a pre-alignment mechanism portion) onto the mounting face of the first holding member, or to transport the substrate on the mounting face to a predetermined transport position (for example a carrier).

Accordingly, with the first aspect, the second holding member (center-up member) comprises a plurality of spoke shape mounting portions which are arranged so as to extend in a radial direction from an approximately central portion of the mounting face of the first holding member, and radial through portions or cavity portions are formed on the mounting face of the first holding member for accommodating the plurality of spoke shape mounting portions.

Moreover, with a second aspect according to the present invention, the first holding member specified in the first aspect has a vacuum attachment groove or a recess portion formed in the mounting face for holding the substrate flatly and correctly with a uniform attachment force, and the spoke shape mounting portions of the second holding member are provided with groove or recess portions for suction attachment.

Furthermore, according to a third aspect of the present invention, an outer rim seen within the mounting face, of the spoke shape mounting portions of the second holding member is contained within a peripheral rim seen within the mounting face, of the through portions or cavity portions of the first holding member, and a clearance is maintained so that the spoke shape mounting portions can relatively rotate by a predetermined amount within the through portions or cavity portions.

Moreover, according to a fourth aspect of the present invention, the transport arm member comprises a load arm for transferring a substrate from the standby position onto the first holding member, and an unload arm for transferring a substrate on the first holding member to the carry out position, and the load arm and unload arm are constructed so as to be positioned in a nesting condition with a predetermined space therebetween in a direction perpendicular to the mounting face so as to be able to pass by each other.

Furthermore, according to a fifth aspect of the present invention, there is provided a Z-drive mechanism for changing the spacing between the upper end face of the spoke shape mounting portions of the second holding member and the mounting face of the first holding member, such that with the spoke shape mounting portions holding the substrate at the most raised position from the mounting face of the first mounting member, a space is formed between the raised substrate and the mounting face into which both of the load arm and unload arm can be inserted without contact.

Moreover, according to a sixth aspect of the present invention, notched portions for the installation of sensors for detecting positional deviation of a peripheral edge of a substrate in a condition with the spoke shape mounting portions of the second holding member holding the substrate and raised by a predetermined amount from the mounting face of the first holding member, are formed at a plurality of locations in the periphery of the first holding member.

Furthermore, according to a seventh aspect of the present invention, there is provided a rotation drive mechanism for rotating the spoke shape mounting portions of the second holding member relative to the first holding member about an axis passing through the approximate center of the mounting face, so as to correct any residual rotation error of a substrate held on the spoke shape mounting portions based on the detection results from the sensor.

Moreover, an eighth aspect of the present invention is applied to a substrate holding apparatus (substrate holder) having a mounting face that is substantially the same shape as a substrate to be processed (for example a circular wafer), and constructed such that an attachment force acts between the mounting face and the substrate during processing of the substrate, and with the eighth aspect of the present invention, radial through portions or cavity portions are formed in a central portion of the mounting face for accommodating radial mounting members which project from the mounting face and support the substrate in an upper side space of the mounting face when the transported substrate is mounted on the mounting face or when the substrate on the mounting face is to be removed.

Furthermore, according to a ninth aspect of the present invention, a plurality of ring shaped attachment grooves for applying an attachment force to a rear face of a substrate are provided at a predetermined first spacing from the central portion of said mounting face towards the outside, and on the periphery of the radial through portions or cavity portions formed in the central portion of the mounting face is also provided attachment grooves following along the shape thereof.

Moreover, with a tenth aspect of the present invention, the radial shape mounting members when viewed within the mounting face comprise three spoke shape mounting portions arranged at approximately 120°, and the radial through hole portions or cavity portions of the mounting face are formed in approximately the same spoke shape such that the three spoke shape mounting portions can be accommodated with a predetermined clearance.

Furthermore, with an eleventh aspect of the present invention, in the case where the substrate is a circular substrate of diameter R, then a central point of a circle circumscribing the three spoke shaped through portions or cavity portions formed in the mounting face is made to coincide with the approximate center of the circular substrate, and the radius of the circumscribing circle is made 5~15% of the diameter R.

Moreover, with a twelfth aspect of the present invention, at the perimeter of fan-shaped regions disposed between the peripheries of respective spoke parts of the three spoke shaped through portions or cavity portions and the circumscribing circle, is formed therealong attachment grooves for applying suction to the substrate rear face. Furthermore, with a thirteenth aspect of the present invention, in an interior side surrounded by the attachment grooves of the fan shaped region is formed a recess portion for opening to the atmosphere.

Moreover a fourteenth aspect of the present invention is applied to a substrate holding apparatus (center-up member) used with a substrate holder having a mounting face that is substantially the same shape as a substrate to be processed and which applies an attachment force between the mounting face and the substrate during processing of the substrate, for relatively protruding from a portion of the mounting face and supporting the substrate in an upper side space of the mounting face, when mounting a substrate on or removing a substrate from the mounting face.

Moreover, with the fourteenth aspect of the present invention, a support portion which relatively protrudes from the portion of the mounting face for contacting with the rear face of the substrate is formed in a plurality of spokes so as to be accommodated without contact in radial through portions or cavity portions formed in the mounting face of the substrate holder.

Moreover, with a fifteenth aspect of the present invention, the multi-spoked support portion is fitted with a drive mechanism for vertical drive between a lower position where the multi-spoked support portion is accommodated in the radial through portions or cavity portions of the substrate holder, and the raised position where the multi-spoked support portion protrudes from the mounting face of the substrate holder.

Furthermore, with a sixteenth aspect of the present invention, on each of the plurality of spokes of the support portion, there is provided an attachment recess or attachment hole for applying a suction force when a substrate rear face is contacted with an upper side face thereof.

Moreover, with a seventeenth aspect of the present invention, the attachment recesses formed in each of the plurality of spokes of the support portion are formed with their center portions mutually connected, and a region for applying an attachment force to a substrate rear face is made in the form of a plurality of spokes connected at their center.

Furthermore, with an eighteenth aspect of the present invention, the plurality of spoke shaped support portions comprise three spokes extending from a central shaft portion and spaced at approximately 120° with distances L from the center approximately equal, and in the case where the substrate to be held is a circular substrate of diameter R (for example 300 mm), the respective distances L of the spoke shape support portions are made 5~15% (5~45 mm) of the diameter R.

Moreover, with a nineteenth aspect of the present invention, at least one of the transport apparatus of the first aspect, the holding apparatus of the eighth aspect, and the holding apparatus of the fourteenth aspect is mounted on a substrate processing apparatus for exposure processing, measurement and inspection processing, or treatment processing of a substrate.

With the present invention, when for example a circular shape wafer of 300 mm diameter is held, since the wafer is supported so as to be movable vertically relatively with respect to the substrate holder, and the center portion of the wafer is supported by a plurality of spoke shape mounting members (support members) extending radially from the center of the substrate holder, then stable retention of the wafer is possible.

Furthermore, since at the center of the substrate holder, through or cavity portions are formed in a spoke shape (petal shape) for accommodating the plurality of spoke shape mounting members (support members), then also in the case where the substrate holder vacuum attaches the substrate, there is the advantage of a reduced possibility of deterioration in the degree of flatness of the substrate.

With the present invention, a transport apparatus for which stable substrate transport is possible by accurate delivery can be obtained even when the substrate to be processed is a large size, and a holding apparatus which can hold such a large substrate stably and with good flatness can be obtained. Moreover, with the present invention, when for example a circular wafer of 300 mm diameter is held, since the center portion of the wafer is moved vertically relatively with respect to the substrate holder, and supported by the plurality of spoke shape mounting members (holding members) extending radially from the center of the substrate holder, then stable retention of the wafer is possible.

Furthermore, since at the center of the substrate holder, through or cavity portions are formed in a spoke shape (petal shape) for accommodating the plurality of spoke shape mounting members (holding members), then also in the case where the substrate holder vacuum attaches the substrate, there is the advantage of a reduced possibility of deterioration in the degree of flatness of the substrate.

DESCRIPTION OF THE PREFERRED EMBODIMENTS

Figure 1:
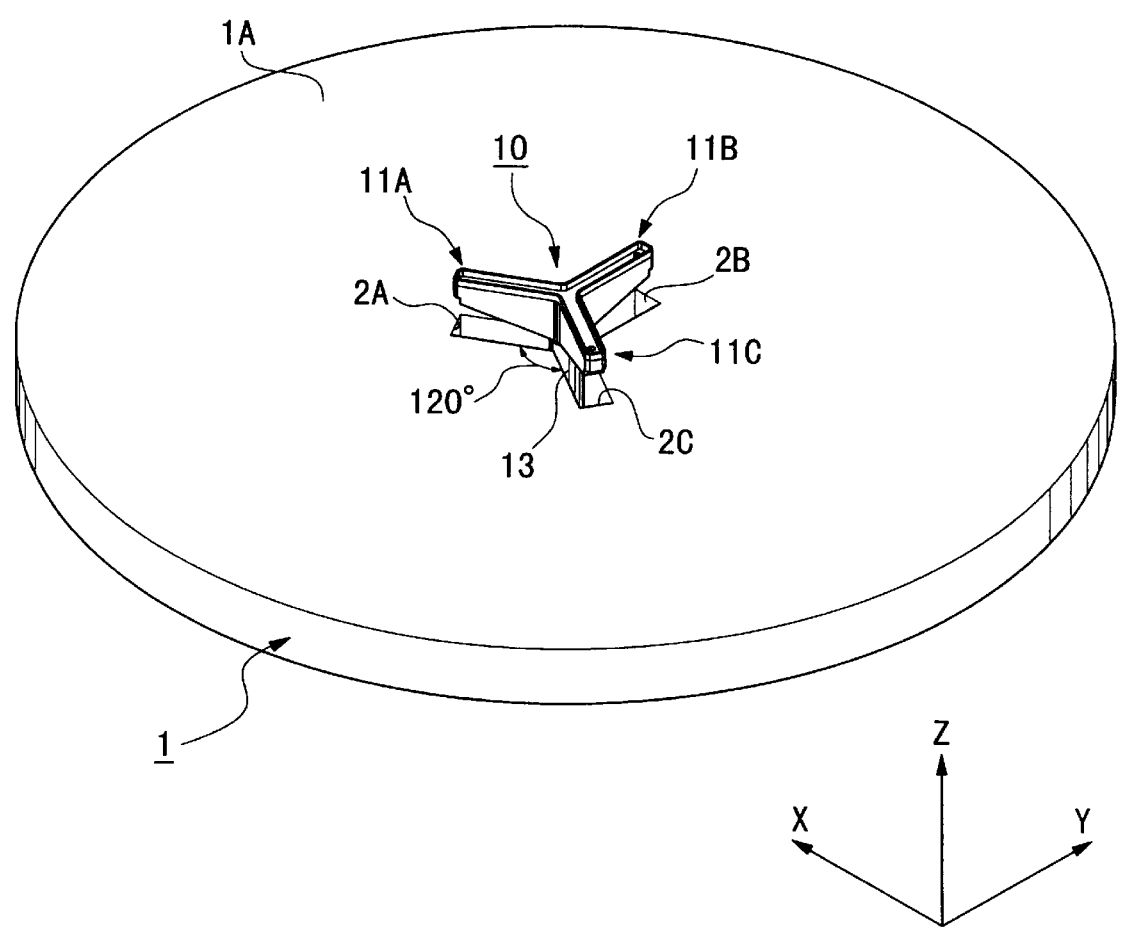
FIG. 1 is a perspective view showing a schematic overall construction of a substrate holding apparatus according to the present invention.
Figure 2:
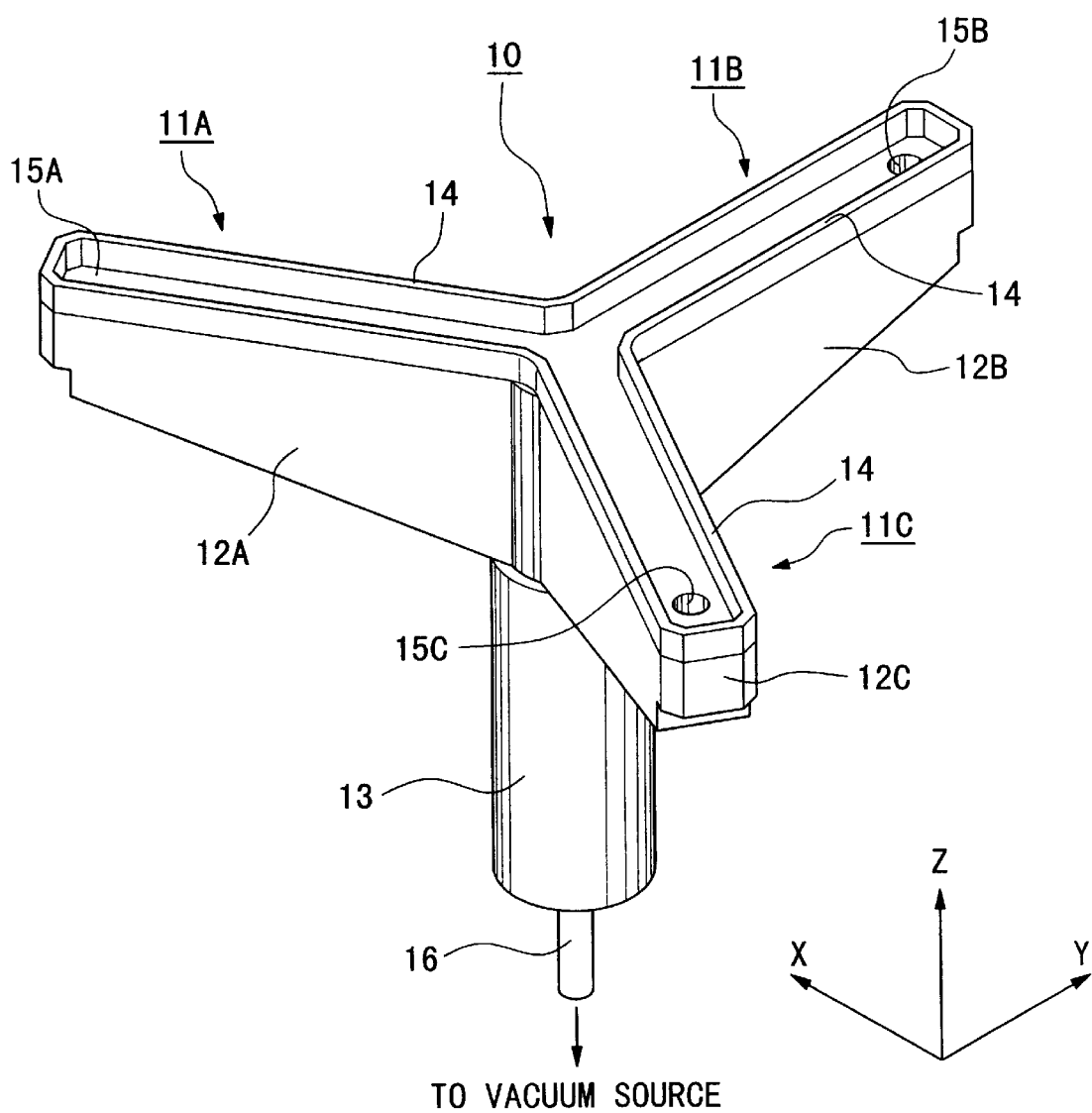
FIG. 2 is a perspective view showing a schematic overall construction of the spoke shape center-up member shown in FIG. 1.

Next is a description of a first embodiment as a suitable form of the present invention, with reference to FIG. 1 and FIG. 2. FIG. 1 is a perspective view schematically showing a substrate holding apparatus (substrate holder and center-up member) comprising the characteristic construction of the present invention. Here a center-up member 10 is raised a predetermined amount from the surface of a substrate holder 1. FIG. 2 is a perspective view showing an enlargement of the center-up member shown in FIG. 1. In FIG. 1, the substrate holder 1 is formed in a circular shape with the outside having a mounting face 1A of approximately circular shape so as to attach and hold a circular semiconductor wafer of 300 mm (12 inch) diameter. Although omitted in FIG. 1, a plurality of attachment grooves or a plurality of attachment holes for attachment of the rear face of a wafer are formed at an appropriate spacing and location over substantially the entire mounting face 1A.

Furthermore, three through portions 2A, 2B, 2C are formed in a central portion of the substrate holder 1 extending radially from the center with approximately 120° spacing on a circumference centered on the center of the mounting face 1A. Consequently, the through portions 2A, 2B, 2C, when viewed within the mounting face 1A (in the X-Y plane), are formed as three spokes (or petals) connected at the central portion of the substrate holder 1. Moreover, in the case of a 12 inch wafer, the length from the center of the mounting face 1A to the radial edge portion of the respective through portions 2A~2C is set to 20~35 mm, and the width of the respective through portions 2A~2C is set to 8~14 mm.

Regarding the center-up member 10, this has a shaft portion 13 passing through a through portion in the central portion of the substrate holder 1, and three spoke shape support portions 11A, 11B, 11C formed integral with or fixed to the upper portion of the shaft portion 13. The spoke shape support portions 11A~11C, when viewed in the X-Y plane, extend linearly in radial directions in an arrangement at 120° to each other, and are formed in a shape so as to be accommodated without contact in the through portions 2A, 2B, 2C of the substrate holder 1. Consequently, with each of the spoke shape support portions 11A~11C, the length from the center is set to 19~34 mm and the width in the circumferential direction is set to 5~12 mm, both being set to slightly less than the length in the radial direction and the width in the circumferential direction of the corresponding through portions 2A~2C.

Moreover, on the upper side portion of each spoke portion 11A~11C is formed a radially extending recess portion serving as an attachment groove for vacuum attachment of a rear face of a wafer. These recess portions are also formed so as to be common with the central portion where the three spoke portions 11A, 11B, 11C intersect. The entire upper side face of the center-up member 10 contributes to the vacuum attachment of the wafer. Therefore, stable wafer retention with much improved suction force is possible, compared to the conventional method for vacuum attachment at tip ends portions of three independent support members (for example pipes of around 4 mm diameter).

This type of center-up member 10 is constructed for example as shown in detail in FIG. 2. The three spoke portions 11A, 11B, 11C have respective spoke pedestal portions 12A, 12B, 12C integrally formed (or formed as separate members secured together) extending radially from the shaft portion 13. These pedestal portions 12A~12C have a strong construction being formed in a taper shape with the thickness in the height direction (Z direction) increasing from the radial tip end portion side towards the shaft portion 13 side so as to suitably maintain the flatness of the upper side faces (attachment holding faces) of the spoke shape support portions 11A~11C.

Furthermore, loop shaped protrusions 14 for contacting with the wafer rear face are formed on the upper face of the pedestal portions 12A~12C along the external shape within the X-Y plane of the three spoke portions 11A~11C. These loop shaped protrusions 14 may be formed integral with the pedestal portions 12A~12C, or a separate members may be formed and these bonded (or welded) to the upper face of the pedestal portions 12A~12C. In this case also, the loop shaped protrusions 14 are made by molding from an electroconductive material having minimal dust generation for contacting with the wafer, or by processing a mother material such as a ceramic and then vapor depositing an electroconductive semiconducting film to a thickness of ten to several tens of microns.

Moreover, as shown in FIG. 2, recess portions are formed at a constant depth around the entire inside of the loop shaped protrusions 14, and the interiors of these recess portions are connected to a vacuum source via a tube 16 passing through a central portion of the shaft portion 13, and suction holes 15A, 15B, 15C formed near the tip end of each of the spoke portions 11A~11C and passing through the interior of the pedestal portions 12A~12C.

As described above, with the present embodiment, since the upper edge face of the entire loop shaped protrusions 14 contacts with the wafer rear face to effect vacuum attachment, the upper edge face of the loop shaped protrusions 14 is polished to a flatness of an accuracy such that vacuum leakage does not occur. With this polishing operation, after at least forming the loop shaped protrusions 14 as one member on the pedestal portions 12A~12C, a thin electroconducting film having minimal dust generation may be vapor deposited thereon and then simply processed with a lapping apparatus or the like. This is simpler than the conventional operation where the upper side faces of the three independently provided support members are worked and adjusted to lie in the same plane.

At the same time as this, it is also necessary for the upper edge faces of the loop shaped protruding portions 14 and the mounting face 1A of the substrate holder 1 shown in FIG. 1 to be set so as to be as parallel as possible. This is because if the degree of parallel is poor, then when the center-up member 10 is lowered from the condition with the wafer attached and held on the upper end of the protruded center-up member 10 so that the wafer is transferred to the mounting surface 1A of the substrate holder 1, the wafer will be inclined down on the mounting face 1A, and hence at the time of producing the suction attachment force on the mounting face 1A side a transverse deviation of the wafer may occur.

Figure 3:
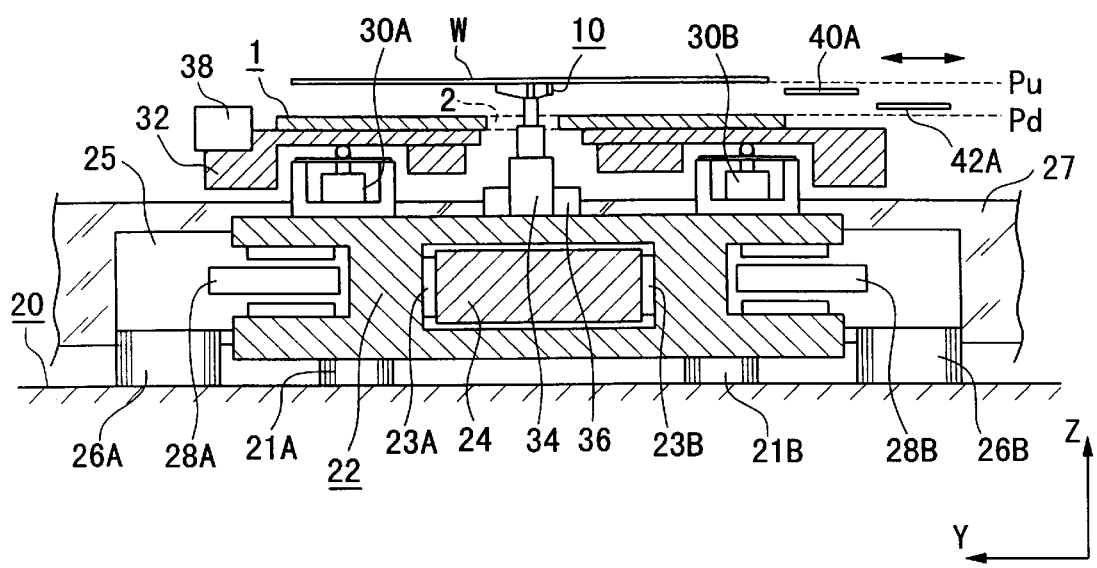
FIG. 3 is a sectional view showing the overall construction of an X-Y stage for a projection type optical exposure apparatus on which is mounted the substrate holding apparatus of FIG. 1.

Next is a brief description referring to FIG. 3 of the construction of a substrate stage mechanism inside a projection exposure apparatus on which is mounted the substrate holder 1 and the center-up member 10 shown in FIG. 1 and FIG. 2. FIG. 3 shows a partial section of a substrate stage mechanism for two dimensional movement in the X-Y plane by means of an air bearing type guide and linear motor. The substrate holder 1 is attached to the upper side of the X-Y stage mechanism.

In FIG. 3, a stage body 22 is provided on a face of a surface plate 20 extending in the X-Y plane, via pads 21A, 22B of an air bearing. A movable rectilinear guide member 24 extending in the X-direction passes via air bearings 23A, 23B through an opening provided through a central portion of the stage body 22 in the X-direction (in a direction perpendicular to the page). Moreover, opposite ends of the movable rectilinear guide member 24 are secured to Y-direction movable members 25, and these Y-direction movable members 25 are supported on the surface plate 20 via air pads 26A, 26B.

Furthermore, the Y-direction movable members 25 are also guidingly supported via air pads with respect to fixed rectilinear guide members 27 secured to the surface plate 20 so as to linearly extend in the Y-direction. Moreover, two X linear motors 28A, 28B are arranged in parallel with the movable rectilinear guide member 24 at peripheral portions of the stage body 22, and a fixed element (one of the coil array or magnet array) of each motor 28A, 28B is secured to the Y-direction movable members 25 on each side.

Although not shown in FIG. 3, the Y-direction movable members 25 are driven in the Y-direction by a Y-linear motor disposed in parallel with the fixed rectilinear guide members 27. Consequently, by means of the drive of the Y-linear motor, the Y-direction movable member 25, the movable rectilinear guide member 24 and the two X-linear motors 28A, 28B move as one in the Y-direction, and at the same time, the stage body 22 guidingly supported on the movable rectilinear guide member 24 also moves in the Y-direction on the surface plate 20. Furthermore, by means of the drive of the two X-linear motors 28A, 28B, the stage body 22 guidingly supported on the movable rectilinear guide member 24 moves in the X-direction on the surface plate 20.

On the above described stage body 22 there is provided a ZL stage 32 which is translationally moved by a small amount in the Z direction by means of three Z direction linear motors 30A, 30B, 30C (here 30C is omitted) to adjust the inclination by a small amount with respect to the X-Y plane. A moving mirror 38 is secured to a side edge portion of the ZL stage 32 for reflecting a beam from a laser interferometer for measuring, the X-Y co-ordinate position of the stage, slight rotational displacement around the Z axis (yawing), slight rotational displacement around the X axis (rolling), and slight rotational displacement around the Y axis (pitching).

Incidentally, the beforementioned substrate holder 1 of FIG. 1 is mounted on the ZL stage 32 and a Z-drive portion 34 for moving the center-up member 10 vertically within a predetermined range, and a θ drive portion 36 (θ drive portion for minutely rotating the substrate holder 1 as required on the ZL stage 32) for minutely rotating the center-up member 10 about a central position of the substrate holder 1 are provided on the stage body 22.

In FIG. 3, the center-up member 10 is raised by the Z-drive portion 34 to the fully raised position, and a wafer W is attached and held to the upper side face (on the loop shaped protruding portions 14) of the center-up member 10. On the central portion of the ZL stage 32 is formed an opening portion of a size to encompass at least the three spoke shaped through holes 2A~2C formed in the center of the substrate holder 1, to allow for the through passage of the center-up member 10 and the Z-drive portion 34.

Furthermore, in FIG. 3 there is shown a load arm 40A and an unload arm 42A which vacuum attach the rear face of the wafer W and are moved rectilinearly in the Y-direction. The load arm 40A and the unload arm 42A are spaced apart in a tiered arrangement at a predetermined spacing in the Z direction (for example two or more times the thickness of the wafer W), and are movable back and forth in the Y-direction by respective independent drive systems, so that during the Y movement stroke, they have different displacements with respect to each other.

Moreover, the height position of the wafer mounting face (upper face) of the load arm 40A is set as shown in FIG. 3 to be slightly downward (for example a few mm) from the height position Pu of the upper side face of the center-up member 10 when this is fully raised, and the height position of the rear face of the unload arm 42A, being the face on the opposite side to the wafer mounting face (upper face) is set as shown in FIG. 3 to be slightly upward (for example by a few mm) from the height position Pd of the mounting face 1A of the substrate holder 1. In this way, with the center-up member 10 holding the wafer W at the fully raised condition, a space is formed between the raised wafer W and the upper face of the substrate holder 1 into which both the load arm 40A and the unload arm 42A can be inserted without contact.

Figure 4:
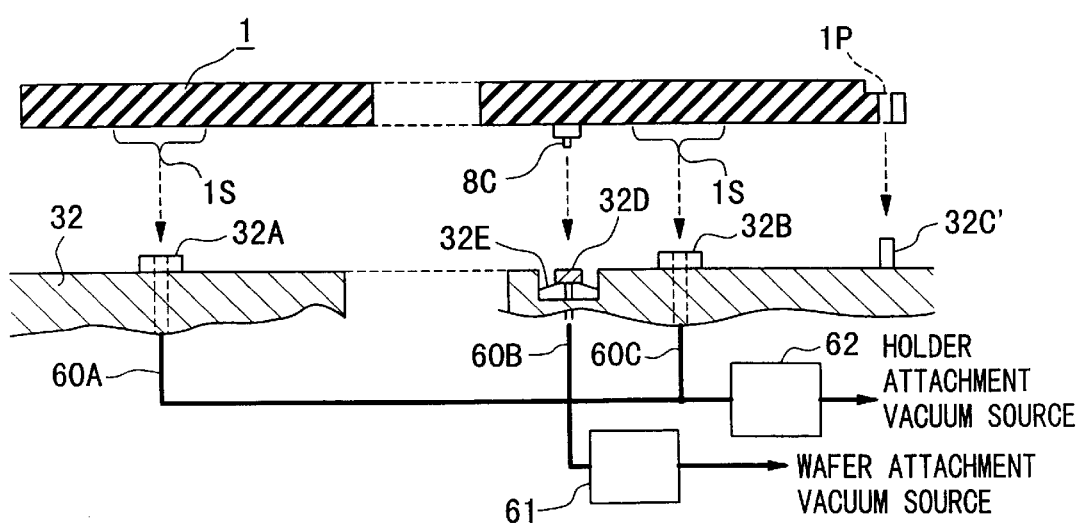
FIG. 4 is a sectional view for explaining a construction for attaching the substrate holder to the X-Y stage shown in FIG. 3.

With the above construction, in order to increase the simplicity of the cleaning operation and the replacement operation of the mounting face 1A, the substrate holder 1 is constructed so that it can be easily removed from and mounted on the ZL stage 32. One example of this construction will be explained with reference to FIG. 4. FIG. 4 shows a partial section of the substrate holder 1 and the ZL stage 32. At a part of the outer peripheral portion of the substrate holder 1 there is provided location holes 1P (for example at 2 locations) for engaging with pins 32C' (at 2 locations) embedded in a part of the holder attachment face on the ZL stage 32.

Moreover, on the holder attachment face of the ZL stage 32 there is provided vacuum attachment ports 32A, 32B, 32C (32C omitted from the figure) respectively contacting with attachment faces 1S formed at three locations on the lower face of the substrate holder 1. The upper end faces of the respective ports 32A, 32B, 32C are formed as evenly as possible so as to all lie in the same plane. These ports 32A, 32B, 32C are connected via tubes 60A, 60B, 60C (60C omitted from the figure) and a solenoid valve 62, to a holder attachment vacuum source.

Consequently, when mounting the substrate holder 1 on the ZL stage 32, the substrate holder 1 is located and mounted on the ZL stage 32 so that the location pins 32C' at the plurality of locations are inserted in the location holes 1P. At this time, the upper end faces of the attachment ports 32A, 32B, 32C are respectively sealed against the attachment faces 1S corresponding to the bottom face of the substrate holder 1. Therefore, by subsequently opening the solenoid valve 62, the substrate holder 1 is vacuum attached to the ZL stage 32.

Moreover, for wafer attachment at the mounting face 1A of the substrate holder 1, a connector 8C communicating with the attachment groove or the attachment hole of the mounting face 1A is fixed to the bottom face of the substrate holder 1, and a connector 32D is mounted via a plate spring 32E serving as a resilient urging member, on the ZL stage 32 side at a location so as to connect with the connector 8C. Consequently, when the substrate holder 1 is mounted on the ZL stage 32, the connector 32D which is urged upward by the plate spring 32E is pressingly contacted with the connector 8C to form a suction path.

Then, when a wafer is attached and held on the substrate holder 1, a vacuum (for example around 300 mmHg) is supplied to the mounting face 1A from the wafer attachment vacuum source, via a tube 60B connected to the connector 32D and a solenoid valve 61. Moreover, when the substrate holder 1 is removed from the ZL stage 32, the solenoid valve 61 is switched so as to shut off the connection to the suction source and open the tube 60B to the atmosphere, so that the suction force at the attachment ports 32A~32C is abruptly switched off, after which the substrate holder 1 can be lifted.

In the above manner, since the substrate holder 1 is held on the ZL stage 32 by the vacuum attachment force, removal and mounting is simple. Moreover, when the incline position of the ZL stage 32 is neutral, then the operation for adjusting parallelism of the mounting face 1A of the substrate holder 1 and the best image plane of the projection system within a permissible range is also easily performed. Furthermore, this has the advantage that also with the cleaning operation of the mounting face 1A of the substrate holder (primarily the removal of flaked off particles of resist), since the entire substrate holder 1 can be removed from the ZL stage 32, then the operation is simple.

Incidentally, the load arm 40A and the unload arm 42A shown before in FIG. 3 move back and forth in the Y-direction guided by a rectilinear guide member extending from a case body side of a wafer loader mechanism positioned away from the surface plate 20. Accordingly, a schematic construction of the wafer loader mechanism will be simply explained with reference to FIG. 5.

Figure 5:
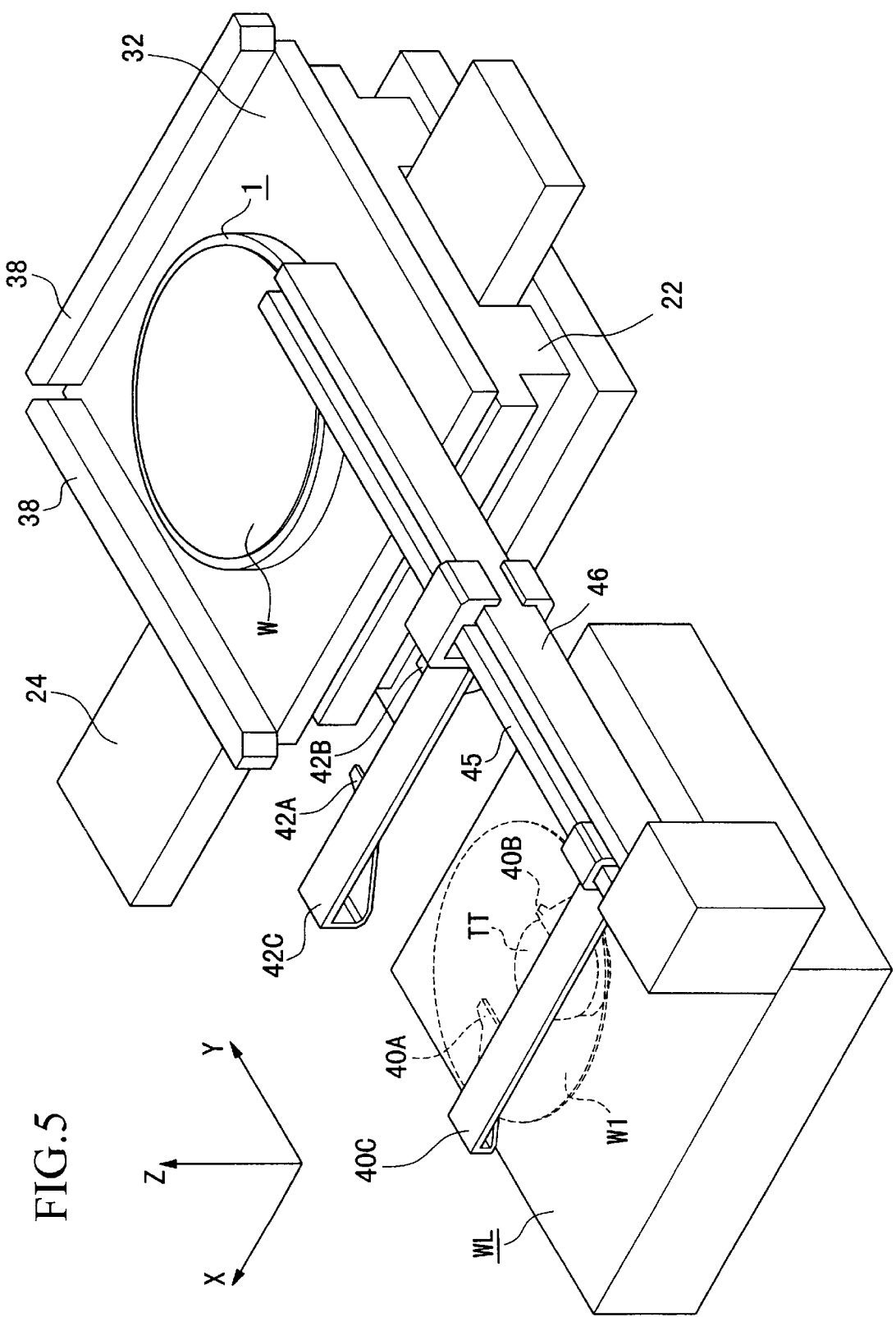
FIG. 5 is a perspective view showing the schematic overall construction of a wafer loader mechanism of a projection type optical exposure apparatus to which the X-Y stage of FIG. 3 is applied.

FIG. 5 typically shows one part of a wafer transport apparatus for a projection exposure apparatus disclosed for example in Japanese Unexamined Patent Application, First Publication No. Hei 7-240366, being a perspective view showing the condition with the stage body 22 shown in FIG. 3 positioned at a wafer exchange position (loading position) under control of a laser interfermometer and respective linear motors. At this time, a line connecting a rotation center of a turning table TT serving as a pre-alignment section inside the wafer loader mechanism WL and a central point of the substrate holder 1 on the stage body 22 is set approximately parallel with the Y axis.

In FIG. 5, members the same as the respective members of the stage mechanism shown in FIG. 3 are denoted by the same reference symbol. Moreover, the upper end face of the center-up member 10 located at the center of the substrate holder 1 is in a condition slightly lowered (for example by 1~2 mm) below the mounting face 1A of the substrate holder 1, and the wafer W is vacuum attached on the mounting face 1A of the substrate holder 1.

Furthermore, two parallel rectilinear slide guide members 45, 46 are extended parallel with the Y axis from the wafer loader mechanism WL towards one side of the substrate holder 1, and on the inside slide guide member 45 of the two slide guide members, a load side arm member 40C which integrally supports the load arm 40A as shown in FIG. 3 is supported so as to be rectilinearly movable in the Y-direction by a linear motor or the like (not shown in the figure), while on the outside slide guide member 46, an unload side arm member 42C which integrally supports the unload arm 42A as shown in FIG. 3 is supported so as to be rectilinearly movable in the Y-direction by a linear motor or the like (not shown in the figure).

As shown in FIG. 5, in order to attach and hold the rear face of the wafer to the load side arm member 40C at two locations in the X-direction, not only is the load arm 40A secured to the load side arm member 40C but also a load arm 40B is secured thereto in an axially symmetric shape and position to the load arm 40A. Moreover, in order to attach and hold the rear face of the wafer to the load side arm member 42C at two locations in the X-direction, not only is the load arm 42A secured to the load side arm member 42C but also a load arm 42B is secured thereto in an axially symmetric shape and position to the load arm 42A. The load side arm member 40C and the unload side arm member 42C are in a nesting condition with each other when viewed in the X-Z plane.

Consequently, the wafer transported by the arm member 40C (or 42C) is held by the arms 40A, 40B (or 42A, 42B) so as not to contact with the central portion of the rear face at two locations on opposite sides in the X-direction of the central portion. Therefore, even in the case where suction attachment at the upper face of the arms 40A, 40B (or 42A, 42B) is not possible due for example to non performance of the vacuum piping system, if the motion of the arm member 40C (42C) is stopped, the wafer will not drop from the arms 40A, 40B (or 42A, 42B). Hence the wafer can be safely protected.

In FIG. 5, the wafer W1 positioned on the wafer loader mechanism WL is an unexposed wafer for processing, shown in the condition immediately after being transferred from the turning table TT onto the load arms 40A, 40B. For this positioning, in order to photodetect and locate the orientation flat or notch in the wafer W1, the turning table TT incorporates a mechanism for attaching and turning the wafer W1 through 360° or more, and a function for raising the wafer W1 to a position slightly above the upper face of the load arms 40A, 40B after aligning the direction of the orientation flat or notch in a predetermined direction.

With the above wafer loader mechanism WL, the mounting plane defined by the respective upper faces of the load arms 40A, 40B, and the mounting plane defined by the respective upper faces of the unload arms 42A, 42B, are necessarily parallel to a predetermined accuracy with, the upper face (holding face) of the turning table TT, the mounting face 1A of the substrate holder 1, and the upper end face (holding face) of the center-up member 10.

Here the wafer transport operation of the abovementioned first embodiment will be briefly described. The operation will be described following the condition as shown in FIG. 5 where the leading single wafer W is attached on the substrate holder 1, and the next unexposed wafer W1 is attached and held on the load arms 40A, 40B of the wafer loader mechanism WL.

When as shown in FIG. 5, the stage body 22 is located at the loading position, then immediately prior to release of the suction attachment by the mounting face 1A of the substrate holder 1 (for example several mS~several tens of mS beforehand), the center-up member 10 starts to be slowly raised by the Z-drive mechanism 34 as shown in FIG. 3, and suction attachment by the end face (the loop shaped protruding portions 14) is commenced. As a result, the upper end face of the center-up member 10 contacts with the rear face of the wafer W.

With this contact, the signal of a pressure sensor (not shown in the figure) for detecting the vacuum at the upper end face of the center-up member 10 changes, and when this signal becomes a specified value, the center-up member 10 is judged to be attach to and holding the wafer W, and the Z-drive mechanism 34 lifts the center-up member 10 at high speed to the maximum lift position. If at this time, the signal of the pressure sensor does not change normally, it is judged that an attachment error has occurred. The center-up member 10 is thus prevented from being raised further, and for safety is returned to its lowest position.

In this way, when the wafer W is lifted as far as the open space position Pu above the substrate holder 1 as shown in FIG. 3, the unload arm member 42C which is standing by at the reset position is guided on the outside guide member 46 and moved rectilinearly in the direction of the substrate holder 1, and in relation to the Y-direction, the unload arms 42A, 42B are positioned to the sides of the raised center-up member 10.

On completion of this positioning, vacuum attachment (suction operation) at the upper face of the unload arms 42A, 42B is commenced, and the center-up member 10 starts to be lowered gradually so that the rear face of the wafer W is contacted with the upper face of the unload arms 42A, 42B to commence attachment holding. At this time, poor attachment by the unload arms 42A, 42B is checked for by the pressure sensor (not shown in the figure), and if reliable attachment is confirmed, the vacuum attachment at the upper end face of the center-up member 10 is rapidly released. As a release method, a method where compressed air is momentarily supplied via a solenoid valve to the vacuum attachment suction holes may be considered.

Since by the above operation, during lowering of the center-up member 10 the upper end face thereof separates from the rear face of the wafer W, then rectilinear movement of the unload arms 42A, 42B towards the turning table TT of the wafer loader mechanism WL is commenced before the center-up member 10 is fully accommodated in the substrate holder 1. At approximately the same time as this, rectilinear movement of the load arm member 40C positioned as shown in FIG. 5, towards the substrate holder 1 is commenced.

In this way, the unload arms 42A, 42B holding the exposed wafer W, and the load arms 40A, 40B holding the unexposed wafer W1 pass by each other at an intermediate location of the moving stroke of the slider guide members 45, 46. In the case of this embodiment, the construction is determined so that the unexposed wafer W1 is on the upper side and the exposed wafer W is on the lower side when passing by each other, so that minute particles of dust or dirt of the order of microns do not drop from the exposed wafer W onto the unexposed wafer W1.

Then, when the wafer W1 is moved by the load arms 40A, 40B to the upper space of the substrate holder 1, the center-up member 10 starts to be raised while again executing the vacuum suction operation, and contacts with the rear face of the unexposed wafer W1 held on the load arms 40A, 40B. At this time, once the attachment of the wafer W1 by the center-up member 10 is verified by the pressure sensor, the attachment by the load arms 40A, 40B is abruptly released.

In this way, the wafer W1 is lifted by the center-up member 10 from the upper faces of the load arms 40A, 40B to a slightly (for example 1 to several mm) raised position Pu, and when with this lifting the pressure sensor for detecting the attachment of the load arms 40A, 40B verifies release of the wafer W1, the load arms 40A, 40B are withdrawn from the lower side space of the unexposed wafer W1 to a reset position the same as that of the unload arms 42A, 42B shown in FIG. 5.

Then finally, the center-up member 10 starts to be lowered slowly with the wafer W1 attached and held on the upper end face, and together with this the vacuum suction action at the mounting face 1A of the substrate holder 1 is commenced. The wafer W1 then contacts with the mounting face 1A so that attachment is commenced, and at the same time the attachment by the center-up member 10 is abruptly released. At the same time, the attachment of the wafer W1 by the substrate holder 1 is verified by means of the pressure sensor (not shown in the figure), and after this verification, the stage body 22 (and the unexposed wafer W1) is moved in the X-Y-direction for wafer alignment, being an exposure preparation operation (principally an operation to detect the position of the alignment mark on the wafer).

In the above manner, with the first embodiment of the present invention, even with a large diameter wafer above 300 mm (circular substrate), since for wafer transport there is only formed the similarly shaped through holes 2A~2C for passage of the three spoke (petal type) center-up member 10, then a substrate holder (substrate holding apparatus) is obtained which does not result in poor flatness of the wafer at the time of attachment and holding. Furthermore, by making the center-up member 10 also as three spoke shapes, the attachment and holding force at the time of wafer delivery can be sufficiently maintained. Hence an apparatus for accurately holding and transporting a wafer in a stable condition can be obtained.

Figure 6:
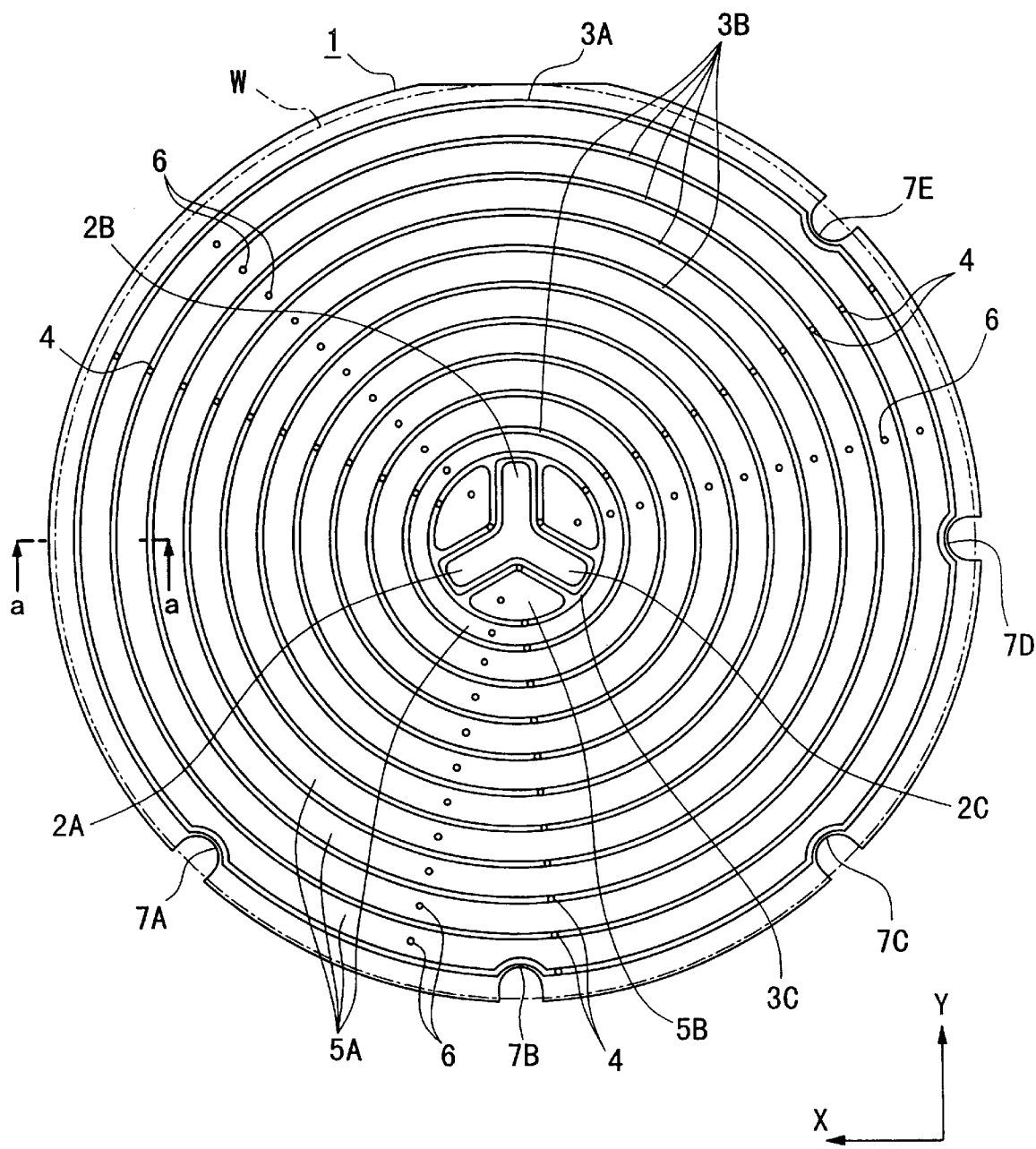
FIG. 6 is a plan view showing the mounting face shape of a substrate holder according to a second embodiment of the present invention.
Figure 7:
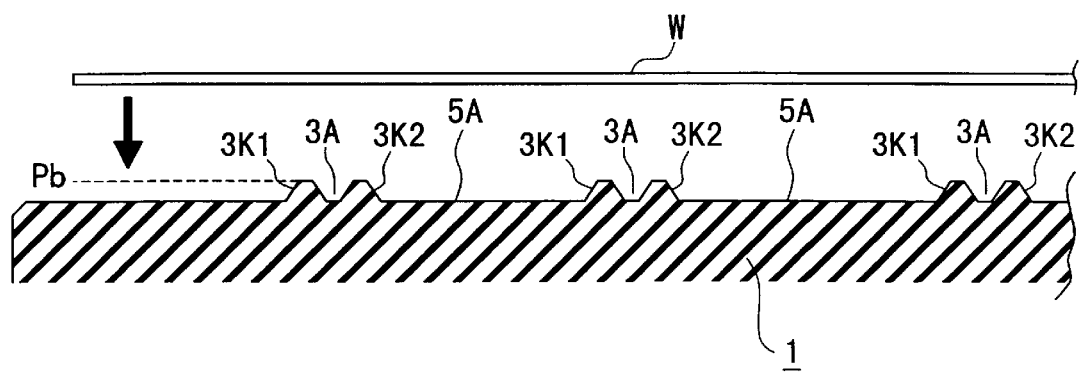
FIG. 7 is a partial sectional view on arrows a—a of the substrate holder shown in FIG. 6.
Figure 9:
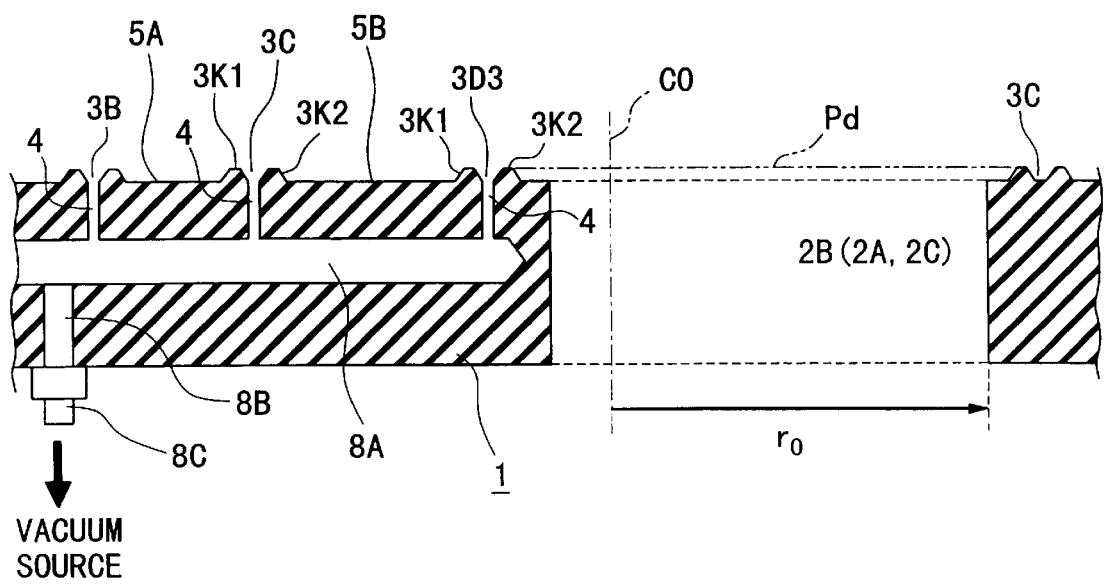
FIG. 9 is a partial sectional view on arrows b—b of the substrate holder shown in FIG. 8.
Figure 8:
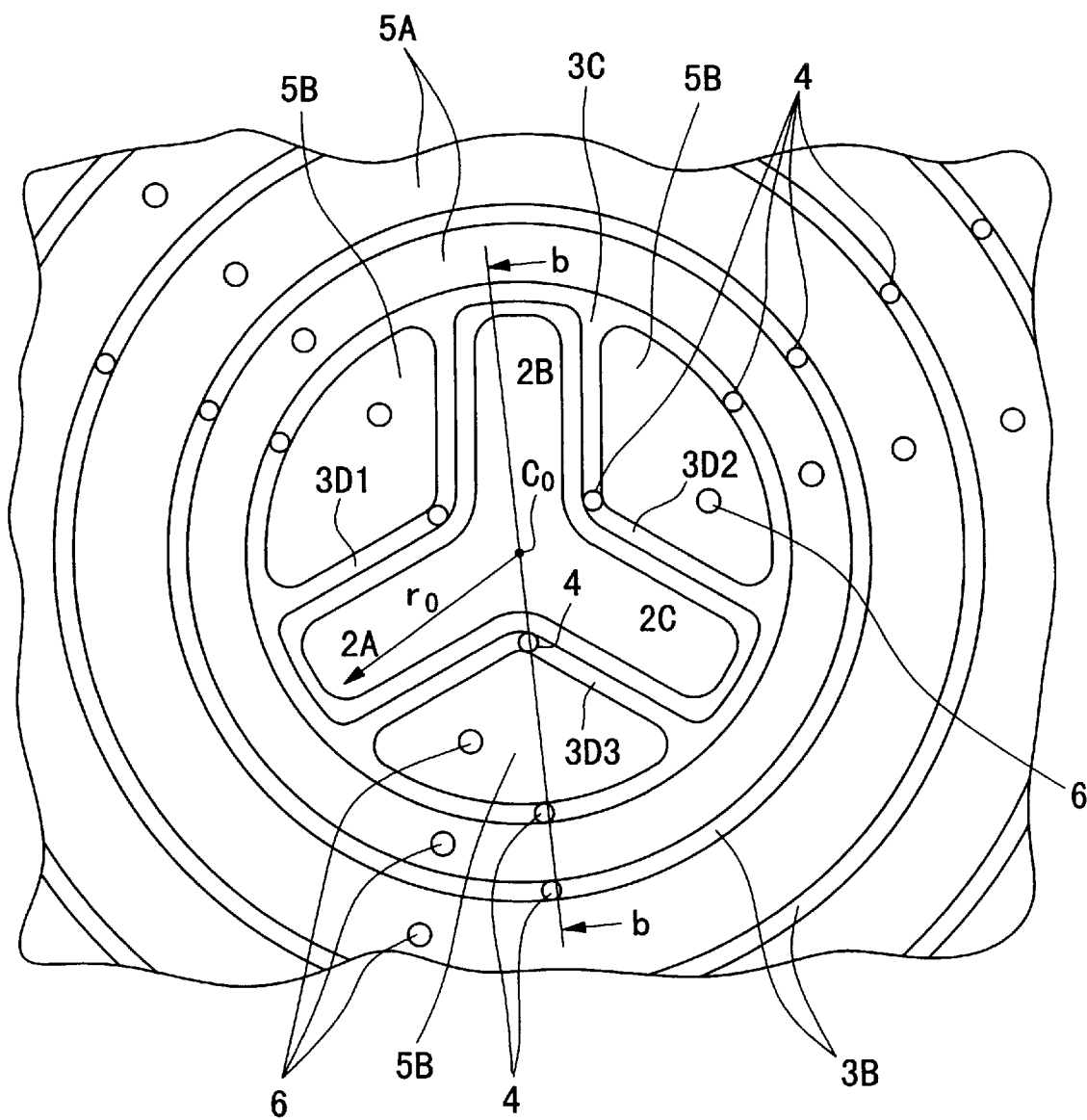
FIG. 8 is a partially enlarged view showing a mounting surface shape in the vicinity of petal type through holes of the substrate holder shown in FIG. 6.

Next is a description with reference to FIG. 6 through FIG. 9, of one example of the location and shape of grooves or suction holes or the like for suction attachment, formed in the mounting face of the substrate holding apparatus (substrate holder 1) of the present invention, serving as a second embodiment. FIG. 6 is a plan view showing the overall outside shape and the mounting face structure of the substrate holder 1, FIG. 7 is a sectional view on arrows a—a in FIG. 6, FIG. 8 is an enlarged plan view of the mounting surface structure near the center of the substrate holder 1, and FIG. 9 is a sectional view on arrows b—b in FIG. 8.

In FIG. 6, the external shape of the substrate holder 1 is formed as a disc which is slightly larger than the external shape of a 300 mm (12 inch) wafer W. At the center is formed petal shaped through holes 2A, 2B, 2C for passage of the three spoke center-up member 10. This substrate holder 1 is held on the ZL stage 32 constructed as described before in FIG. 4, or on a θ stage provided on the ZL stage 32 so as to be slightly rotatable.

Here with this embodiment, a plurality of attachment grooves 3A, 3B, 3C are formed in substantially concentric rings on the upper face of the substrate holder 1. These attachment grooves 3A~3C as shown in the enlarged view of FIG. 7, are formed as recess portions of around 1 mm width contained between by a pair of trapezoidal shape protrusions 3K1, 3K2. The height of each protrusion 3K1, 3K2 is made around 0.1~1 mm, and the width of the apex face of each protrusion 3K1, 3K2 (the contact face for the wafer rear face) is made around 0.05~1 mm.

Moreover, the radial spacing of the attachment grooves 3A, 3B, 3C as shown in FIG. 6, is specified to around 10~15 mm. Suction apertures 4 which are connected to a suction source are formed inside each of the attachment grooves 3A, 3B, 3C at three approximately evenly spaced locations in the circumferential direction. Ring shape regions 5A between the respective attachment grooves are formed by the protrusions 3K1, 3K2 as recesses (of around 0.1~1 mm depth). Apertures 6 which are communicated with the atmosphere are formed at each of three approximately evenly spaced locations inside each ring shape recess 5A.

With regards to the operational effect of the mounting surface structure as described above, this is as disclosed for example in Japanese Unexamined Patent Application, First Publication No. Hei 1-319965. However, by making the total contact surface area (the total area of the apex faces of the protrusions 3K1, 3K2) on the wafer rear surface as small as possible, and distributing the contact locations of the wafer rear surface substantially uniformly, then the settling of minute particles of dust or dirt between the protrusions 3K1, 3K2 of the mounting face 1A and the rear face of the wafer W can be reduced.

Accordingly, in the case where the mother material for the substrate holder 1 is a metal, then after polishing the overall surface of the mother material to a uniformly flat surface, each of the attachment grooves 3A, 3B, 3C constituting the recess portions and the ring shape recesses 5A, can be machined to a predetermined depth, or the protrusions 3K1, 3K2 may be formed by polishing. In the case where the mother material is a ceramic, the portions which become the protrusions 3K1, 3K2 can be formed beforehand as recess portions in the mould used at the time of sintering.

Furthermore in the case where the mother material is a ceramic, since from the start the cross-section structure as shown in FIG. 7 has been formed, then after forming a conducting film (of silicon carbide, titanium carbide or the like) by a CVD method to a thickness of several hundred microns over the entire surface, part of the surface, in particular the conducting film deposited on the apex faces of the projections 3K1, 3K2 which contact with the wafer, may be lapped to ensure a predetermined surface accuracy, for example to an overall surface mean value of around ±1 μm, and around ±0.2 μm within predetermined local regions. Here the height position Pd of the mounting face 1A of the substrate holder 1 shown before in FIG. 3, strictly speaking becomes the surface specified by the apex of the protrusions 3K1, 3K2 as shown in FIG. 7.

Incidentally, the reason for the ring shape recesses 5A shown in FIG. 6 being communicated with the atmosphere is that if there were no communication with the atmosphere, then after contacting and vacuum attaching the wafer W to the apex face of the protrusions 3K1, 3K2 as shown in FIG. 7, after a while the interior of the ring shape recesses 5A would also change to a negative pressure, resulting in the local parts of the wafer W corresponding to the ring shape recesses 5A bending downwards slightly due to the negative pressure. The communication with the atmosphere is to stop this bending.

Of the attachment grooves 3A, 3B, 3C shown in FIG. 6, the attachment groove 3A formed in the outermost peripheral portion of the substrate holder 1 is formed so as to be located inside the outer peripheral edge of the wafer W by a few millimeters, and in a shape so as to bypass inside each of five cut-out portions 7A~7E provided on the outer peripheral portion of the substrate holder 1 as recesses for the optical sensors for sensing the wafer outer peripheral edge.

In each of the cut-out portions 7A~7E is placed a photoelectric sensor (or linear array sensor) mounted on the ZL stage 32 side, so that the sensors receive light from five beams projected downwards from a mirror tube side of an optical projection system (not shown in the figures) when the stage body 22 shown in FIG. 3 is at a loading position.

Furthermore, of the five photoelectric sensors, in the case where a notch (V-shape cut-out) formed in the peripheral rim of the wafer is set in a zero degree direction, the photoelectric sensor positioned at the cut-out portion 7B detects the notch, and the photoelectric sensors positioned at the cut-out portions 7A, 7C on opposite sides thereof (at ±45° to the cut-out portion 7B), detect the circular edge of the wafer. In this way, with the unexposed wafer maintained by the center-up member 10 in the upper space of the substrate holder 1, the X, Y direction positional displacement amount of the wafer center with respect to the center of the substrate holder 1, and the θ direction displacement amount of the wafer (the remaining rotational discrepancy) is measured.

Similarly, in the case where the notch of the wafer is set in the 90° direction, the photoelectric sensor positioned at the cut-out portion 7D (90° to the cut-out portion 7B) detects the notch, and the photoelectric sensors positioned at the cut-out portions 7C, 7E on opposite sides thereof (at ±45° to the cut-out portion 7D), detect the circular edge of the wafer. Hence the positional displacement of the wafer center and the remaining rotational discrepancy of the wafer is measured. This non contact pre-alignment (measurement operation) for the wafer using the photoelectric sensors is executed while the center-up member 10 is at the upper position Pu, and is described later in detail.

With the substrate holder 1 shown in FIG. 6, attachment grooves which are connected to the attachment groove 3C on the innermost side surrounding in a ring shape all three spoke shape through holes 2A–2C formed at the center of the substrate holder 1, are formed at the periphery of the through holes 2A–2C adjacent to the edge portions having an angle of approximately 120°. In this regard, a description will be given with reference to FIG. 8.

In FIG. 8, of the petal shape through holes 2A–2C formed with a radius r0 from the center C0 of the substrate holder 1, on the left side outer edge portion of the spoke shape through portions 2A and 2B, is formed an attachment groove 3D1 bent at approximately 120° and defined by the protrusions 3K1, 3K2 as shown in FIG. 7. Moreover at the right side outer edge portion of the spoke shape through portions 2B and 2C, is formed an attachment groove 3D2 bent at approximately 120° and defined by the protrusions 3K1, 3K2. Furthermore, at the lower side outer edge portion of the spoke shape through portions 2A and 2C, is formed an attachment groove 3D3 bent at approximately 120° and defined by the protrusions 3K1, 3K2.

These attachment grooves 3D1, 3D2, 3D3 are all formed so as to connect with the ring shaped attachment groove 3C at the innermost periphery, and in the vicinity of the respective curved portions of the attachment grooves 3D1, 3D2, 3D3 is formed suction apertures 4 for communication with a vacuum source. Furthermore, with the fan shaped regions 5B at three locations surrounded by each of the attachment grooves 3D1–3D3 and the attachment groove 3C, since the peripheries thereof are surrounded by the protrusions 3K1, 3K2 for forming the attachment grooves, these are relatively recessed portions, and in each of these fan shaped regions 5B are also formed apertures 6 for communicating with the atmosphere.

Accordingly, the structure of the central portion in the cross-section on arrows b—b in FIG. 8 will now be explained in detail with reference to FIG. 9. The respectively formed suction apertures 4 of the ring shape attachment grooves 3B, 3C and the curved attachment groove 3D3 are made so as to communicate with a suction path 8A which is sealingly formed inside the substrate holder 1, extending radially from near the outer periphery of the substrate holder 1 towards the center C0. The suction path 8A is connected to a vacuum source (including a solenoid valve, a flow regulating valve etc.) by a vacuum piping tube via a suction path 8B formed in a bottom portion of the substrate holder 1, and a connector 8C.

As shown in FIG. 8, the apertures 6 for opening to the atmosphere are also arranged in lines radiating from the center C0. At the bases of the linearly arranged apertures 6 is formed a path to the atmosphere which passes through inside the substrate holder 1, as with the suction path 8A of FIG. 9. These atmosphere paths and the suction paths 8A, as will be clear from the respective arrays of suction apertures 4 and aperture 6 for opening to the atmosphere in FIG. 6 and FIG. 8, are each formed in threes at an angular spacing of approximately 120°.

In the above manner, with the mounting surface structure of the substrate holder 1 according to this embodiment, the attachment grooves 3D1, 3D2, 3D3 are provided adjacent to the respective peripheral rims of the three spoke shape through portions 2A, 2B, 2C which form the petal shape through holes, and the fan shape regions 5B produced on the inside of the ring shape inner most attachment groove 3C, being the outside of the attachment grooves 3D1, 3D3 is a recessed portion open to the atmosphere. Therefore when a wafer is attached and held on the substrate holder 1, the effect is obtained that the flatness at the wafer central portion can be well maintained and is not inferior to the flatness at other parts.

Figure 10A:
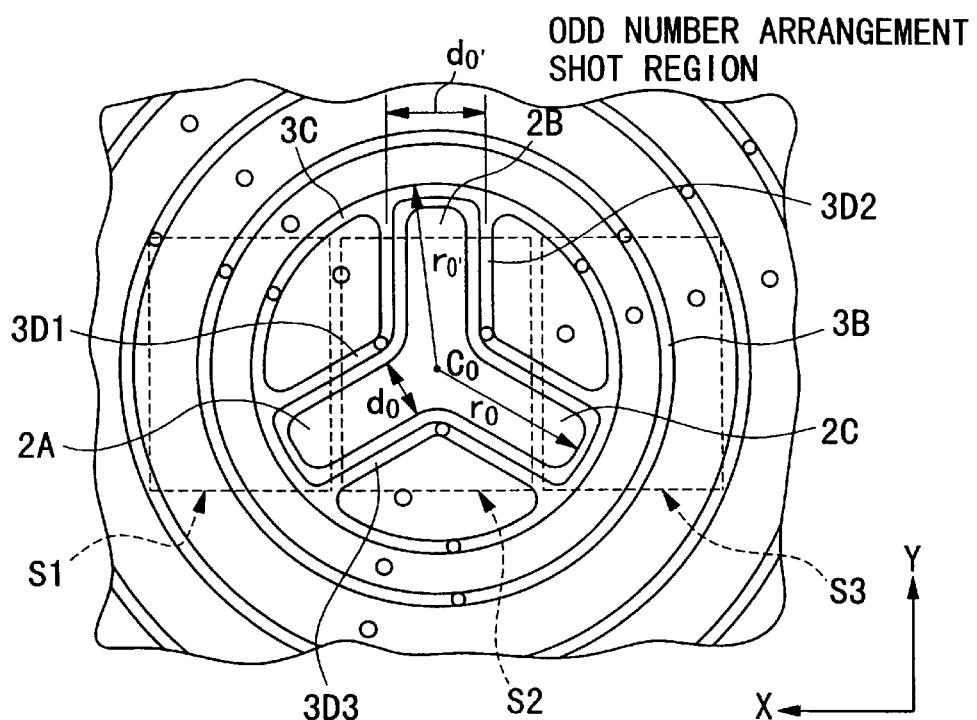
FIG. 10 is a partial plan view for explaining a relation between the petal type through holes and a shot array of semiconductor wafers attached by the substrate holder of FIG. 6.
Figure 10B:
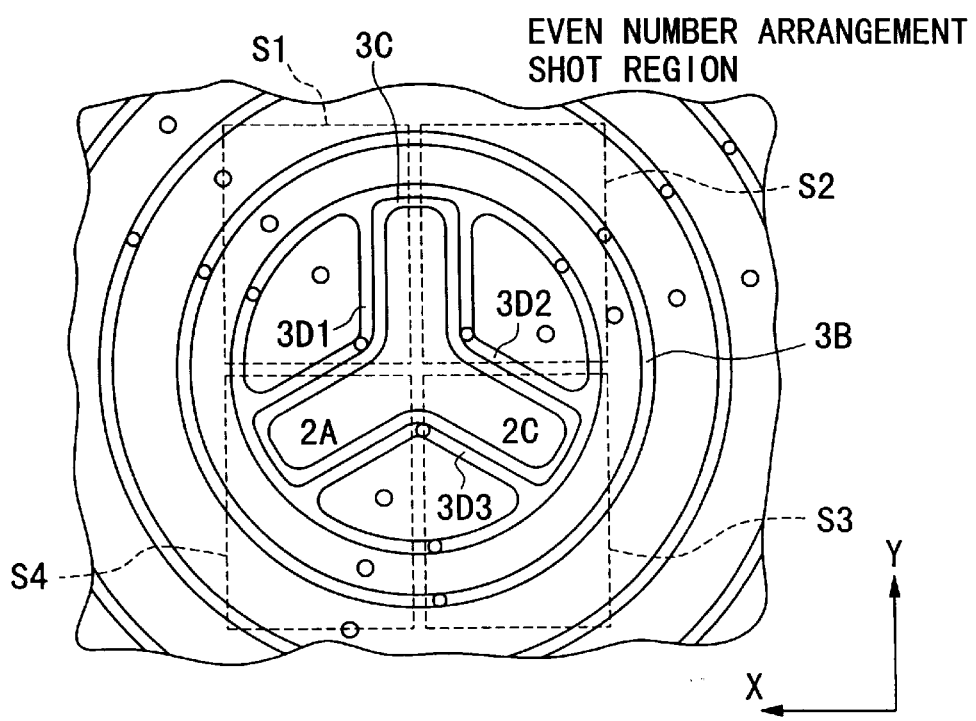

Such an operational effect will be further explained with reference to FIG. 10. FIG. 10 typically shows the mounting face structure in the central portion of the substrate holder 1 the same as in FIG. 8, and the positional relation of exposed shot regions Sn (region to be exposed once by the projection optical system, or regions for one chip portion of a device) formed on a wafer attached and held on the mounting face. FIG. 10(A) shows the case where shot regions S1, S2, S3 on a wafer constitute an odd number arrangement, while FIG. 10(B) shows the case where shot regions S1, S2, S3, S4 on a wafer constitute an even number arrangement.

Furthermore, as shown in FIG. 10(A), when the radii r0 of the petal shape through holes formed in the central portion of the substrate holder 1 are approximately 26 mm corresponding to a 300 mm wafer, and a width d0 of each spoke shape through portion 2A, 2B, 2C is set to approximately 10 mm, then a radius r0' of the ring shape attachment groove 3C located at the innermost periphery, becomes approximately 28 mm, and with the attachment grooves 3D1, 3D2, 3D3 on the outer periphery of the respective spoke shape through holes 2A, 2B, 2C, the central spacing d0' of the portions which are parallel with each other becomes approximately 17 mm.

These numerical values however are only examples, and the dimensions are not limited to these. However it is desirable to set the radius r0 in a range of around 5~15% of the wafer diameter R. Similarly, a length L of each spoke shape mounting portion 11A~11C (support portion) of the center-up member 10 from the center C0, is also set in a range of around 5~15% of the wafer diameter R and so as to be slightly smaller than the radius r0.

These percentages 5~15% are determined experimentally or empirically. If 4% or less, wafer holding by the center-up member 10 becomes unstable, while if 16% or more, the area of the through portions 2A~2C becomes large so that degradation of the flatness at the central portion of the wafer increases. However, the value of 15% is not necessarily the upper limit value, and values greater than this are also possible in the case where the circumferential width of the through portions 2A~2C can be made sufficiently small.

On the other hand, with the size of the shot region Sn, in the case of a projection optical exposure apparatus of the step & scan method where a reticle and wafer on which is supported the circuit pattern is relatively and synchronously moved with respect to a reduced size projection optical system with the resolution greater than 0.25 μm and the NA above 0.5, then normally the shot size related to the scanning movement direction is larger than the size for the non scanning direction. Consequently, in FIG. 10, the Y-direction is the scanning direction and the X-direction corresponds to the non scanning direction.

At present, for the shot regions Sn, the size for the scanning direction is considered to be greater than 33 mm and that for the non scanning direction greater than 27 mm. A projection optical system corresponding to this shot size has already been developed. If such a shot size is assumed, then in the case of the odd number arrangement shown in FIG. 10(A), the center of the shot region S2 at the wafer center is arranged so as to approximately coincide with the center C0 of the substrate holder 1, and the entire shot region S2 is encompassed inside of the innermost ring shape attachment groove 3C.

By having the mounting surface structure of this embodiment, then all of the three 120° curved attachment grooves 3D1, 3D2, 3D3 (and accordingly the protrusions 3K1, 3K2), are positioned beneath the shot region S2 for the case of the odd number arrangement, and hence the flatness at the wafer central portion is not marred.

In the case where the shot regions Sn are an even number arrangement as shown in FIG. 10(B), then the point positioned at the wafer central portion and facing the respective corner portions of the four shot regions S1, S2, S3, S4, coincides approximately with the center C0 of the substrate holder 1. Hence the innermost periphery attachment groove 3C is always positioned beneath the respective shot regions S1~S4 together with one of the three bent attachment grooves, 3D1, 3D2, 3D3, and hence the flatness at the wafer central portion is similarly not marred.

With the arrangement form and dimensions for the attachment grooves illustrated by the embodiment as described above, even though the petal shape through holes 2A~2C of a relatively large area compared to the area of the through holes (a total of three) for passing the conventional three pipe support members, are formed at the central portion of the substrate holder 1, the effect that the substrate of a wafer or the like can be attached and held at a uniform flatness is obtained.

Figure 11:
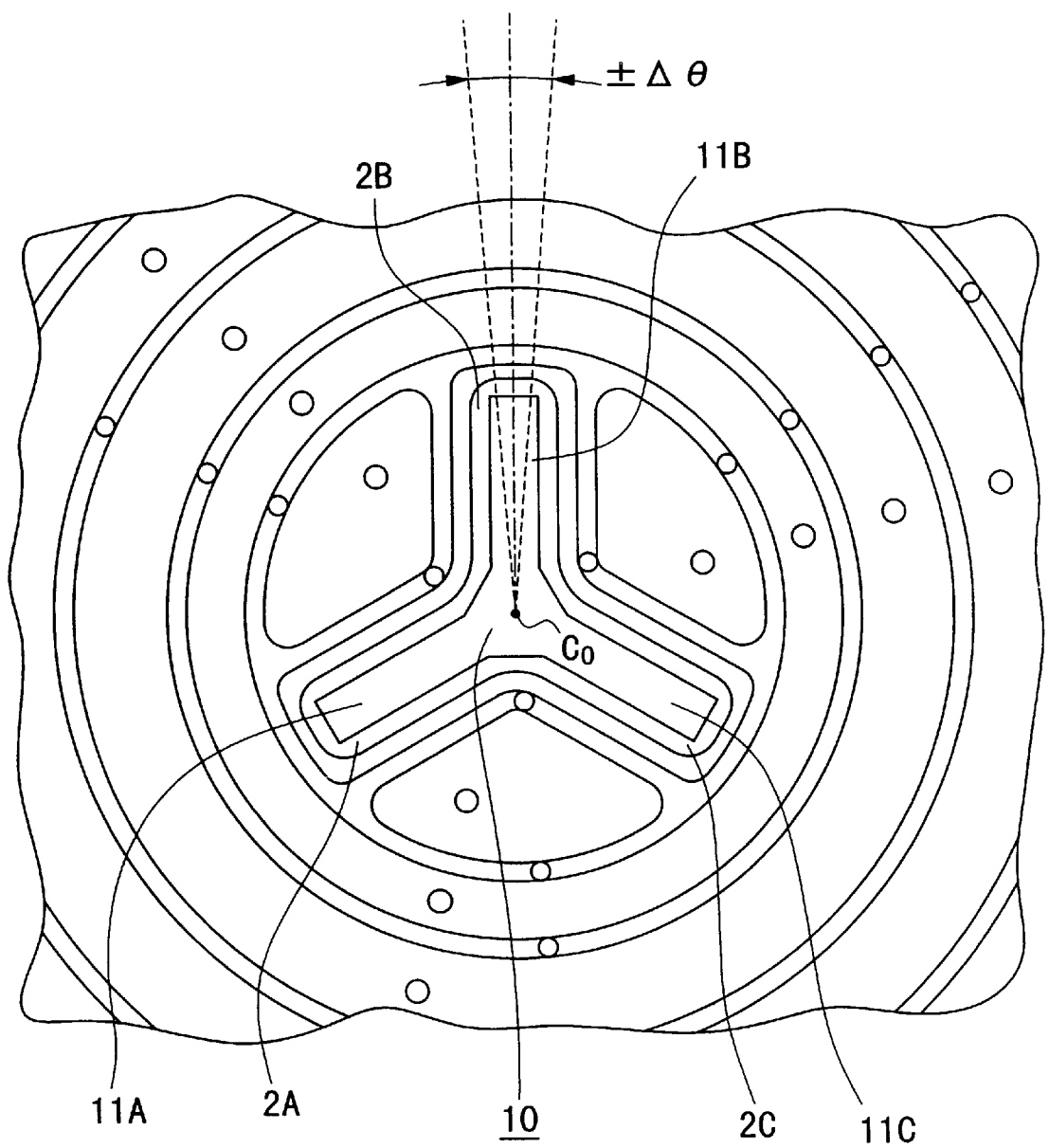
FIG. 11 is a partial plan view for explaining a relative rotation range between the petal type through holes and a spoke shape center-up member in the substrate holder of FIG. 6.

Incidentally, as shown in FIG. 10(A), the width d0 of each of the spoke shape through portions 2A~2C of the petal shaped through holes must be a little larger than the width of the spoke portions 11A, 11B, 11C of the center-up member 10 which passes through these. This is because, as already described for the previous FIG. 3, when using the center-up member 10, the substrate holder 1 is rotated slightly relatively by means of the drive mechanism 36. More specifically, as shown in FIG. 11, the respective spoke members 11A, 11B, 11C of the center-up member 10 are constructed so that these can be relatively rotated by $\pm\Delta\theta$ around the center C0 inside of the corresponding spoke shape through portions 2A, 2B, 2C.

This relative rotation range $\pm\Delta\theta$ is determined depending on the rotation direction pre-alignment accuracy of the wafer in the wafer loader mechanism WL shown before in FIG. 5. For example if this pre-alignment accuracy is within $\pm 1$ degree, then the relative rotation range $\pm\Delta\theta$ is set to be above this.

As described with reference to the previous FIG. 6, cut-out portions 7A~7E necessary for the location of sensors for photoelectrically detecting the peripheral edge position or notch position of a wafer, or for ensuring the optical paths of the sensors, are provided at a plurality of locations on the outer periphery of the substrate holder 1. Such sensors, as disclosed for example in Japanese Unexamined Patent Application, First Publication No. Hei 7-288276, are used to detect two locations of the wafer peripheral edge portion and three locations of the notch portion after the center-up member 10 receives the unexposed wafer W1 and before lowering onto the substrate holder 1, to thus determine the rotation direction error amount of the wafer remaining at the time of pre-alignment, and the X-Y-direction error amount of the geometric center point of the wafer.

The rotation direction error portion of the obtained respective error amounts is used in correcting the rotation position of the center-up member 10 (or the substrate holder 1) by the rotation drive mechanism 36 shown in FIG. 3, and the X-Y-direction error amount is used in correcting (in tempering the off set amount with respect to the moving target position) the moving co-ordinate system of the stage body 22. The details of this operation are disclosed in Japanese Unexamined Patent Application, First Publication No. Hei 7-288276, and hence further description is omitted.

By positioning a photoelectric sensor at the rim portion of the substrate holder 1 as described above, then the positional deviation or rotation error of the unexposed wafer W1 occurring when the wafer is transferred from the load arms 40A, 40B to the center-up member 10, can be identified, with the advantage that the mounting of the unexposed wafer on the substrate holder 1 has a higher accuracy.

Moreover, since the upper end face of the photoelectric sensors located in the cut-out portions 7A~7E of the substrate holder 1 are provided so as to be located beneath the mounting face 1A, then the position of the outer peripheral edge or the notch of the wafer can be photoelectrically detected even in the condition with the wafer attached to the substrate holder 1. There is also the effect that this can be used, in monitoring the slight positional deviation of the wafer on the substrate holder 1 occurring during the exposure process due to unexpected poor attachment and the like, and in appropriate error processing and recovery processing.

Figure 12:
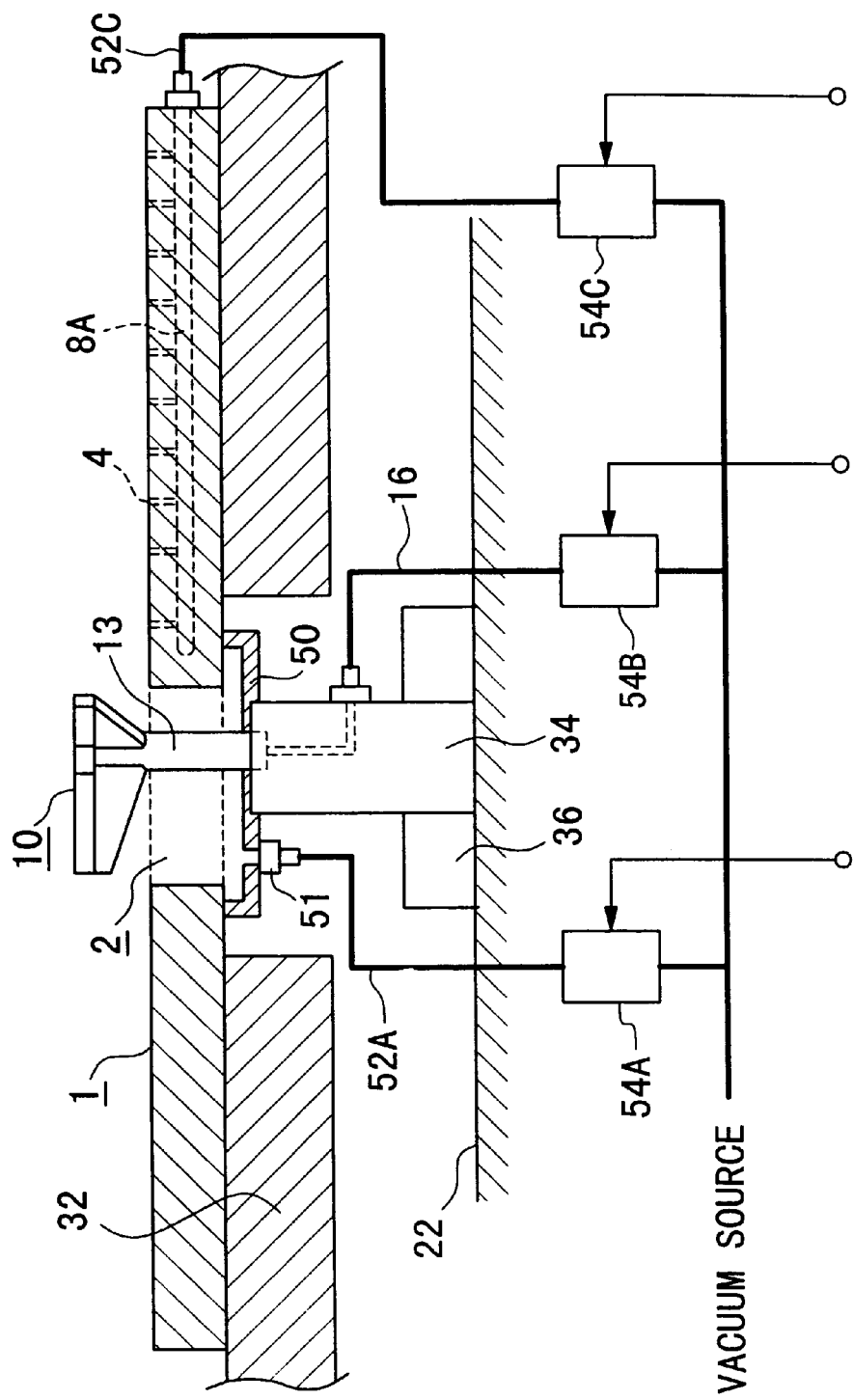
FIG. 12 is a sectional view showing the structure of a stage and a substrate holding apparatus according to a third embodiment of the present invention.

Next is a description of a third embodiment of the present invention with reference to FIG. 12. In FIG. 12, members the same as the respective structural members described for the previous first and second embodiments are denoted by the same reference symbols. With this embodiment, the point that a partition 50 of high airtightness is provided beneath the petal shape through holes 2A~2C formed in the central portion of the substrate holder 1, differs from the wafer stage structure shown before in FIG. 3.

In the partition 50 is formed an opening portion fitted with a pliable seal member such as an O-ring through which the shaft portion 13 of the center-up member 10 passes. The construction is such that the shaft portion 13 can be moved vertically by the Z-drive mechanism 34 and can be rotated slightly by the drive mechanism 36. Moreover, the partition 50 is positioned so as to just cover the lower side of the petal shaped through holes 2A~2C of the substrate holder 1, and on one part of the partition 50 there is provided a communication port 51 connected to a vacuum tube 52A. The reason for having the seal member surrounding the shaft portion 13 pliable is so that this can correspond to the incline movement of the ZL stage 32, or the rotational movement of the θ stage.

If such a partition 50 is provided, then when the wafer is transferred to the mounting face 1A of the substrate holder 1 by lowering of the center-up member 10, and the wafer is suction attached on the mounting face 1A, via the suction path 8A, a vacuum tube 52C and a solenoid valve 54C, then the portion of the petal shape through holes 2A, 2C becomes a closed space surrounded by the rear face of the wafer and the partition 50. By reducing the vacuum pressure of this portion via the vacuum piping tube 52A, and a solenoid valve 54A, then the central portion of the wafer can be attached and held with a greater suction force.

In FIG. 12, the suction attachment of the wafer on the upper end face of the center-up member 10 can be also applied similarly to the previous respective embodiments, however this is performed by way of the tube 16 which is guided through the interior of the shaft portion 13, and a solenoid valve 54B. Furthermore, as will be clear from FIG. 12, since the central lower portion of the substrate holder 1 is covered by the partition 50, then in the case of this embodiment, the petal shape through holes 2A~2C, when considered functionally become cavity portions in the form of three spokes (petal shape).

Incidentally, when the partition 50 is provided as shown in FIG. 12, then removal of the substrate holder 1 can no longer be performed simply. Therefore, as one method of removal, the center-up member 10 may be constructed so as to be easily separated at the location of the shaft portion 13 as shown in FIG. 2, from the Z drive mechanism 34 therebeneath. Then when the substrate holder 1 is removed, the center-up member 10 is lifted as far as the uppermost raised position Pu, and after loosening a clamp such as an engaging screw, the center-up member 10 can be lifted up and removed.

Moreover as another method, a construction is possible where a ring shape protrusion surrounding the petal shape through holes 2A~2C is formed on the lower face of the substrate holder 1, and this protrusion is contacted air-tightly with the upper face of the ZL stage 32. Then, if the partition 50 is provided on the opening portion of the ZL stage 32 side, the removal of the substrate holder 1 can be simply performed as shown before in FIG. 4. However in this case, the partition 50 is formed so as to surround the upper portion of the Z-drive mechanism 34, and hence it is necessary to provide a seal member for maintaining airtightness at a portion of the partition 50 through which the shaft portion 13 of the Z-drive mechanism 34 passes.

In the case, where as with the present embodiment, the vacuum attachment force is activated at the petal shaped through holes (strictly speaking cavity portions) 2A~2C of the central portion of the substrate holder 1, then the mounting surface structure of the central portion of the substrate holder 1 need not necessarily be as shown in FIG. 8.

In the above, various embodiments of the present invention have been described, however in particular the mounting face structure of the substrate holder 1 (arrangement and dimensions of the attachment grooves and protrusions) is not limited to that shown in FIG. 6 through FIG. 9, and various forms can be applied. For example, the various cross-sectional structures of the attachment grooves 3A~3C, 3D1~3D3, and the ring shape recesses 5A, and the fan shaped recesses 5B of the substrate holder 1 shown in FIG. 6 through FIG. 9 may be modified as shown in FIG. 13.

Figure 13:
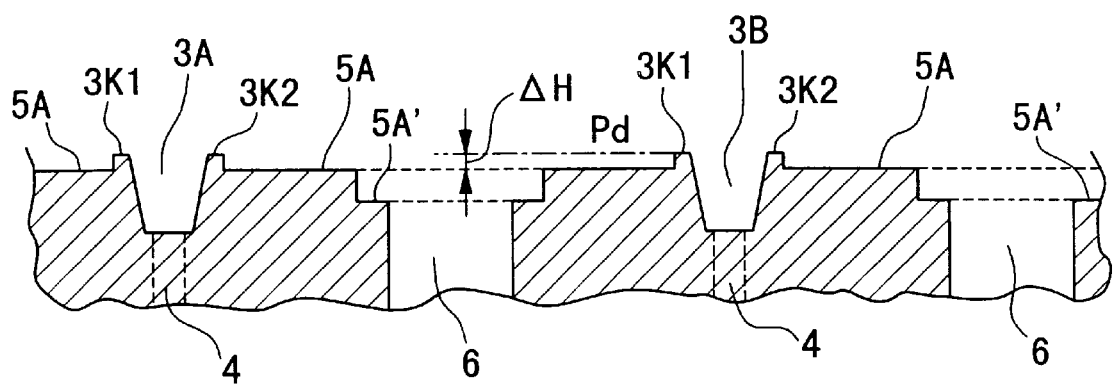
FIG. 13 is a partial sectional view showing a modified construction of a mounting face of the substrate holder.

FIG. 13 shows a partial cross-section of a substrate holder 1, applicable as a modified example of the cross-sectional structure shown before in FIG. 7 or FIG. 9. The principal modification is that the Z direction step difference ΔH between the face of the ring shape recesses 5A (similarly with the fan shape recesses 5B) which constitute the portion open to the atmosphere, and the upper faces (mounting face of height position Pd) of the protrusions 3K1, 3K2 which define the respective attachment grooves, as well as the depth of the respective attachment grooves is made extremely small.

The reason for having the faces which become recess portions with respect to the upper faces of the protrusions 3K1, 3K2 extremely shallow in this way, is so that dust and dirt accumulating in the recess portions of the mounting face 1A can be easily removed at the time of cleaning. Accordingly, to illustrate the dimensions in the mounting face structure shown in FIG. 13, with a ceramic mother material for the substrate holder 1, the depth of the lower face of the respective attachment grooves with respect to the upper face of the protrusions 3K1, 3K2 is around 150~300 μm, the step ΔH is around 15~30 μm and the width of the upper face of the protrusions 3K1, 3K2 is around 0.5~2 mm.

However, because the step ΔH is extremely small like this, then when the wafer is lowered onto the upper faces of the protrusions 3K1, 3K2 and attachment commenced, the air flow in the ring shaped recess portions 5A (similarly with the fan shape recesses 5B) for release to the atmosphere via the apertures 6 is restricted, so that the wafer momentarily sits on the air layer inside the ring shape recess portions 5A, 5B and is displaced sideways. Therefore, in the bottom of the ring shaped recess portions 5A which constitutes the atmosphere opening portion, further recess portions 5A' are formed, and in the bottom of the fan shaped recesses 5B further recess portions 5B' (not shown in FIG. 13) are formed.

These recess portions 5A' are formed at central portions in the widthwise direction (in the radial direction of the substrate holder 1) of the ring shape recesses 5A, with a depth of around 100~500 μm from the upper face of the protrusions 3K1, 3K2, and in a ring shape of a width similar to the diameter of the hole 6. On the other hand, the recess portions 5B' are formed in substantially the same shape as the fan shaped recesses 5B but slightly smaller by around 50~80% of the shape dimensions, and of a similar depth to the recess portions 5A'.

With the substrate holder 1 having a shallow type mounting face as in FIG. 13 described above, then in addition to the effect that the removal rate of dust and dirt (flaked off particles of resist) at the time of the cleaning operation is high, since the gap (ΔH) between the rear face of the wafer and the bottom face of the ring shape recesses 5A or the fan shaped recesses 5B is extremely small, then also in the case where the temperature of the wafer is raised by thermal energy accumulating in the wafer due to the exposure process, there is the effect that this thermal energy propagates to the substrate holder 1 not only via the small contact area protrusions 3K1, 3K2 but also via the areawise large ring shape recesses 5A (and the fan shaped recesses 5B), so that the temperature rise of the wafer is suppressed. That is to say, there is also the effect that the heat dissipation effect is improved.

The substrate holder 1 of the above respective embodiments is a type where a large portion of the mounting face 1A is open to the atmosphere. However this may be a type where the proportion of the total contact area to the overall area of the wafer is reduced by several percent and substantially all of the wafer rear face is sucked. As one example of a substrate holder 1' of such an entire face attachment type, there is the mounting face construction as shown in FIG. 14.

Figure 14:
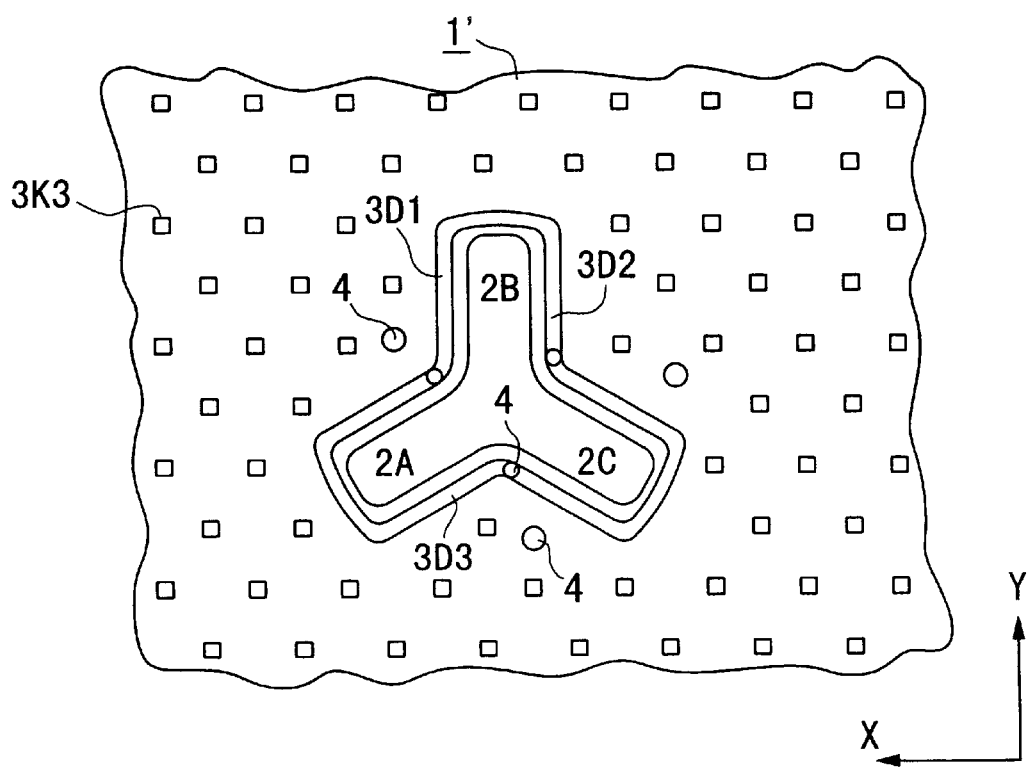
FIG. 14 is a partial sectional view showing a modified construction of a mounting face of a substrate holder according to a fourth embodiment of the present invention.

FIG. 14 shows only the central portion of the substrate holder 1' serving as a substrate holding device according to a fourth embodiment of the present invention. Attachment grooves 3D1~3D3 are arranged adjoining each other at the periphery of petal shape through holes 2A~2C, and suitable suction apertures 4 are provided in the grooves 3D1~3D3. The attachment grooves 3D1~3D3 are defined by protrusions 3K1, 3K2 as shown in FIG. 7 or FIG. 13. Furthermore, while not shown in FIG. 14, only the attachment groove 3A on the outermost periphery shown before in FIG. 6 is formed on the substrate holder 1', in a shape defined by the protrusions 3K1, 3K2.

Between the innermost peripheral attachment grooves 3D1~3D3 and the outermost peripheral attachment groove 3A, there is arranged at even pitches in the X and Y directions, a large number of small rectangular shape protrusions 3K3 for contacting with the wafer rear face, of a height the same as that of the protrusions 3K1, 3K2. The upper faces of the protrusions 3K3 are formed for example as approximately 1 mm squares. The pitch is according to the size and arrangement of the shot region Sn and is set to around 10~20 mm. Moreover, at several locations on the bottom face portion formed by the protrusions 3K3 is provided suction apertures 4 for connection to the vacuum source.

With such a substrate holder 1', the ring shape protrusions which define the innermost peripheral attachment grooves 3D1~3D3 become the outer peripheral rim, while the protrusions which define the outermost peripheral attachment groove 3A becomes the inner peripheral rim, and the entire interior (the arrangement region of the protrusions 3K3) surrounded by these rims becomes a space which is sealed by the wafer, and the pressure reduced. Consequently, if the respective protrusions 3K1, 3K2, 3K3 are too high (for example above 2 mm), then a time delay occurs from when the wafer rear face contacts the respective protrusions 3K1, 3K2, 3K3 until the desired suction force acts.

Therefore the height of the respective protrusions 3K1, 3K2, 3K3 should be kept as low as possible at for example around 0.1 mm. Moreover, also in the case of the substrate holder 1' of FIG. 14, the mother material may be a ceramic, and after depositing a thin conducting film over the entire surface, the upper faces of the respective protrusions can be lapped.

Figure 15:
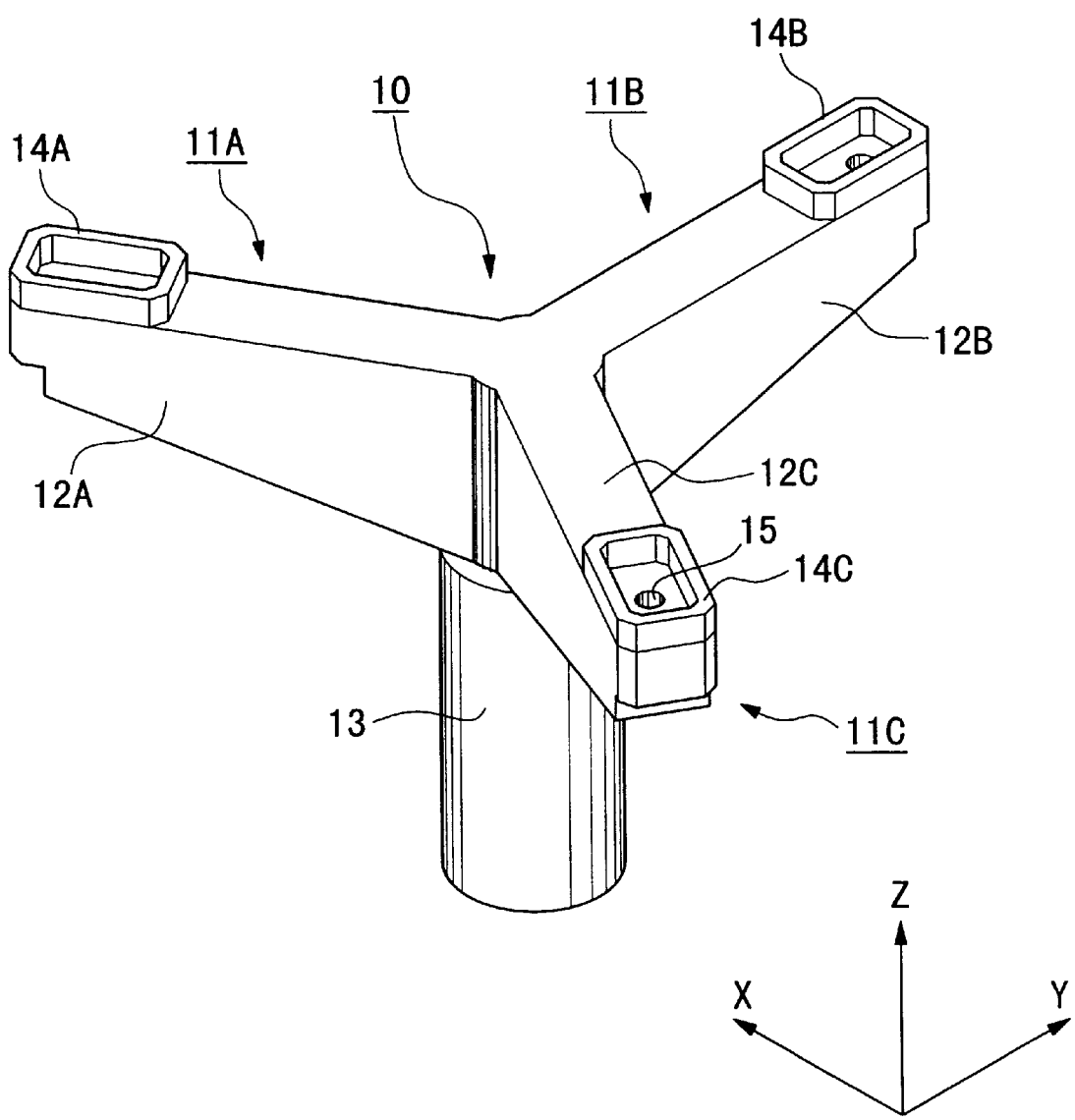
FIG. 15 is a perspective view showing a modified construction of a center-up member according to a fifth embodiment of the present invention.

Next is a description of a modified example of the center-up member 10 as a fifth embodiment of the present invention, with reference to FIG. 15. With this embodiment, near the upper side tips of the respective pedestal portions 12A, 12B, 12C of the three spoke portions 11A, 11B, 11C, loop shape protrusions 14A, 14B, 14C for attaching the wafer rear face are individually provided, and suction holes are formed inside these loop shape protrusions 14A~14C.

In the case of such a center-up member 10, since the contact support portion for the wafer rear face is limited to three local regions spaced around 20~30 mm from the wafer center, then compared to the case of the loop shape protrusions 14 as shown before in FIG. 2, the suction force does not become large. However this has the advantage that even if the wafer is bent significantly in a convex shape or a concave shape, reliable transfer and attachment holding is possible.

The substrate holders 1, 1' illustrated in the above various embodiments were particularly directed to large type circular wafers of approximately 300 mm. However also in the case where the substrate to be attached and held is of a rectangular shape, these can be applied in exactly the same way by making the mounting face of a similar shape. Moreover, the apparatus on which the substrate holders 1, 1' are mounted is not limited to projection type exposure apparatus such as aligners, steppers, lens scanners and the like, but may be some other processing apparatus, measuring apparatus, scanning apparatus where it is necessary to flatly hold a substrate to be processed.

Moreover, the substrate holders 1, 1' or the center-up member 10 are presumed to suction attach and hold the substrate on the upper side face. However depending on the applicable apparatus suction attachment may not necessarily be required. In such a case, the patterning of the protrusions of the mounting face are made to suit this requirement. In particular, with an electron beam exposure apparatus, or a dry etching apparatus or the like where the substrate to be processed is held and transported in an evacuated atmosphere, vacuum attachment by the center-up member 10 or the substrate holder 1, 1' is not possible and hence with these, the substrate is only supported by its own weight.

Alternatively, instead of vacuum attachment, electrodes for electrostatic attachment to the respective surfaces of the center-up member 10 and the substrate holders 1, 1' may be formed by patterning and vapor deposition in a predetermined shape with a conducting thin film of for example metal or the like. Furthermore, while the center-up member 10 described for the respective embodiments has three spoke shape mounting portions 11A~11C of equal lengths from the center and arranged at an angular spacing of 120°, the center-up member is not necessarily limited to this, and the spoke shape mounting portion may be appropriately selected within a range from two to five spokes.

For example, in the case where the spoke shape mounting portion is two spokes, then the bend angle for the spokes may be made around 90°, and the shaft portion 13 connected at the bend point may be positioned slightly eccentric from the center C0 of the substrate holder 1. In this case, the through holes or cavity portions on the substrate holder 1 side which accommodate the two spoke shape mounting portions can be formed at the approximate center of the substrate holder 1 according to the eccentricity of the shaft portion 13, and the center of gravity point of the substrate of the wafer etc., can be set in the inside region between the two spoke shape mounting portions which are bent at 90° to each other.

In the case where the spoke shape mounting portions are four or more, then the width in the circumferential direction of each of the spoke shape mounting portions may be a value smaller than the several values illustrated in the abovementioned embodiments, for example around 3~4 mm. In this way, the substrate attachment force over the entire upper face of the spoke shape mounting portion cannot be lowered. Furthermore, to correspond with this, the width of the respective spoke portions of the petal shape through holes or cavity portions formed on the substrate holder 1 may be made less.

Figure 16:
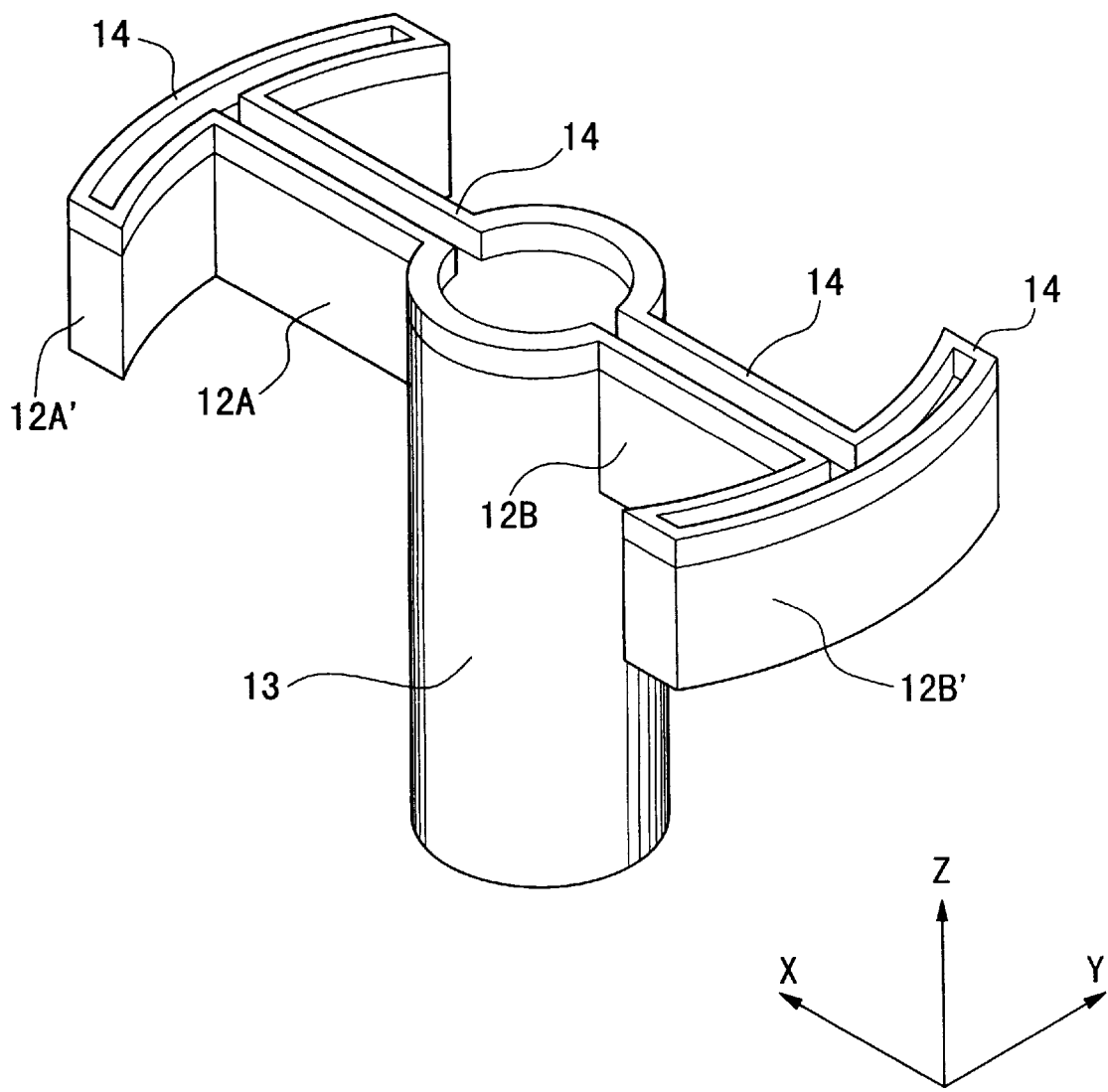
FIG. 16 is a perspective showing a further modified construction of a center-up member.

Incidentally, as a modified example of a center-up member basically constituted by two spoke shape mounting portions the construction may be as shown in FIG. 16, incorporating spoke shape pedestal portions 12A, 12B extending transversely (X-direction) from a shaft portion 13, and arcuate shape pedestal portions 12A', 12B' having shapes lying on concentric circles, secured to the tip end of the respective pedestal portions 12A, 12B, provided with loop shape protrusion 14 for defining recess portions for vacuum attachment, on respective upper side faces of the shaft portion 13, the spoke shape pedestal portions 12A, 12B and the arcuate shape pedestal portions 12A', 12B'.

With the center-up member of the construction of FIG. 16, then even if the width in the circumferential direction of the spoke shape pedestal portions 12A, 12B is very small (the width in the Y-direction in FIG. 16), since the arcuate pedestal portions 12A', 12B' have some length in the Y-direction, then the substrate can be stably held. Furthermore, the radial width of the pedestal portions 12A', 12B' is set to be smaller than for example the width of the ring shape recess portions 5A for opening to the atmosphere as shown before in FIG. 6. Moreover, in addition to the through holes or cavity portions in the substrate holder 1 for accommodating the shaft portion 13 and the pedestal portions 12A, 12B, through hole portions or cavity portions for accommodating the arcuate shape pedestal portions 12A', 12B' are formed in parts inside loop shape recess portions 5A which are at radial locations corresponding to the arcuate shape pedestal portions 12A', 12B'.

In the case of such a center-up member, degradation of the degree of flatness arising when a substrate is vacuum attached to the mounting face 1A of the substrate holder 1 is determined by the through hole section of the substrate holder through which the shaft portion 13 and the pedestal portions 12A, 12B pass, and it will be apparent that the through hole portions for the arcuate shape pedestal portions 12A', 12B', which are located at regions which constitute atmosphere openings, do not contribute to worsening of the degree of flatness. Consequently, if the diameter of the shaft portion 13 is made less than 10 mm and the width of the pedestal portions 12A, 12B is small of the order of a few mm, then from the arrangement and size of the shot region, a sufficient degree of flatness can be maintained.

Moreover, the wafer transport load arms 40A, 40B and the unload arms 42A, 42B shown in FIG. 5 are located so that the wafer rear face is held from both sides, however an arm for a method where the wafer rear face is vacuum attached on one side only eccentric from the wafer center portion is also possible. Such an arm may be a shaft type which rotates as well as moving linearly.

As an exposure apparatus to which the above described substrate transport apparatus or substrate holding apparatus according to the present invention is applied, there is for example the scanning type exposure apparatus (for example U. S. Pat. No. 5,473,410) which simultaneously moves a mask and substrate to expose a pattern of the mask, the step-and-repeat type exposure apparatus which exposes a mask and pattern with the mask and substrate in a stationary condition, sequentially stepping the substrate, or the proximity exposure apparatus which does not use a projection optical system, but locates the mask and substrate close together and exposes the pattern of the mask.

Moreover, use of the exposure apparatus, is not limited to the exposure apparatus used for semiconductor manufacture. For example this can be widely applied to liquid crystal exposure apparatus which expose liquid crystal display device patterns on a rectangular glass plate, or in exposure apparatus for the manufacture of thin film magnetic heads. For the light source of the exposure apparatus, not only can a g-line (436 nm) and i-line (365 nm), a KrF excimer laser (248 nm), an ArF excimer laser (193 nm), a F2 laser (157 nm) be used, but also a charged particle beam such as an X-ray or electron beam may be used. For example, in the case where an electron beam is used, then for the electron gun, a thermionic emission type lanthanum hexaborane (LaB6) or tantalum (Ta) electron gun may be used.

Regarding the magnification of these projection optical systems, these may be not only reduction systems but may also be equal magnification and enlargement systems. For the projection optical system, in the case where far ultraviolet radiation such as with an excimer laser is used, then for the glass material, a material which transmits far ultraviolet radiation such as quartz or fluorite is used, and in the case where an F2 laser or an X-ray is used, a reflection/refraction system or refraction system optical system (the reticle also uses a reflecting type) is used. Moreover in the case where an electron beam is used, then for the optical system, an electrooptical system comprising an electrooptic lens and a deflector may be used. Here needless to say, the optical path along which the electron beam passes is evacuated.

Moreover, for the substrate transport apparatus, instead of using the linear motion type transport arm for transporting the substrate from the pre-alignment portion onto the substrate holder as with the present embodiment, a method which performs all of the substrate transport with an articulated type robot arm is possible. In this case, the substrate kept in a carrier or an inline stock portion is transferred to the turning table TT of the pre-alignment portion by the robot arm, and the pre-aligned substrate is then again transferred by the robot arm onto the substrate holder 1.

Moreover, a semiconductor device is typically manufactured by for example; a step for performing function and performance design of the device, a step for controlling the reticle based on this design step, a step for producing a wafer from a silicon material, a step for exposing and developing a wafer which has been coated with a resist in a pattern of a reticle, using an exposure apparatus which is aligned with a coater, a device assembly step (including a dicing step, a bonding step and a packaging step), and a scanning step, and at times in these steps it is necessary to hold and transport the wafer. Hence the present invention can be widely applied to apparatus specified for these wafer handling steps.

What is claimed is:

1. A transport apparatus provided with:
    a first holding member having a mounting face with substantially the same shape as that of a substrate to be processed for supporting a substrate on said mounting face,
    a second holding member for holding a rear face of a substrate, which projects from one portion of the mounting face of said first holding member at a time of transporting the substrate, in order to hold the substrate in an upper side space of the mounting face of said first holding member, and
    a transport arm member for moving a substrate between at least one of a standby position and a carry out position, and the upper side space of said first holding member in order to transport the substrate from a predetermined standby position onto the mounting face of said first holding member, or to transport the substrate on said mounting face to a predetermined transport position, wherein
    said second holding member comprises a plurality of spoke shape mounting portions which are arranged so as to extend in a radial direction from an approximately central portion of the mounting face of said first holding member, and radial through portions or cavity portions are formed on the mounting face of said first holding member for accommodating said plurality of spoke shape mounting portions.

2. An apparatus according to claim 1, wherein said first holding member has a vacuum attachment groove or a recess portion formed in said mounting face for holding said substrate flatly and correctly with a uniform attachment force, and the spoke shape mounting portions of said second holding member have groove or a recess portions for suction attachment.

3. An apparatus according to claim 1, wherein an outer rim seen within the mounting face, of the spoke shape mounting portions of said second holding member is contained within a peripheral rim within the mounting face, of the through portions or cavity portions of said first holding member, and a clearance is maintained so that said spoke shape mounting portions can relatively rotate by a predetermined amount within said through portions or cavity portions.

4. An apparatus according to claim 1, wherein, said transport arm member comprises a load arm for transferring a substrate from said standby position onto said first holding member, and an unload arm for transferring a substrate on said first holding member to said carry out position, and said load arm and unload arm are constructed so as to be positioned in a nesting condition with a predetermined space therebetween in a direction perpendicular to said mounting face so as to be able to pass by each other.

5. An apparatus according to claim 4, wherein there is provided a Z-drive mechanism for changing the spacing between the upper end face of the spoke shape mounting portions of said second holding member and the mounting face of said first holding member, such that with said spoke shape mounting portions holding the substrate at the most raised position from the mounting face of said first mounting member, a space is formed between the raised substrate and said mounting face into which both of said load arm and unload arm can be inserted without contact.

6. An apparatus according to claim 1, wherein notched portions are formed at a plurality of locations in the periphery of said first holding member for the installation of sensors for detecting positional deviation of a peripheral edge of a substrate in a condition with the spoke shape mounting portions of said second holding member holding the substrate and raised by a predetermined amount from the mounting face of said first holding member.

7. An apparatus according to claim 6, having a rotation drive mechanism for rotating the spoke shape mounting portions of said second holding member relative to said first holding member about an axis passing through the approximate center of said mounting face, so as to correct any residual rotation error of a substrate held on said spoke shape mounting portions based on the detection results from said sensor.

8. A substrate holding apparatus having a mounting face that is substantially the same shape as a substrate to be processed, and constructed such that an attachment force acts between said mounting face and the substrate during processing of said substrate, wherein radial through portions or cavity portions are formed in a central portion of the mounting face for accommodating radial mounting members which project from said mounting face and support the substrate in an upper side space of said mounting face when the transported substrate is mounted on said mounting face or when the substrate on said mounting face is to be removed.

9. An apparatus according to claim 8, wherein on said mounting face there is provided at a predetermined first spacing from the central portion of said mounting face towards the outside a plurality of ring shaped attachment grooves for applying an attachment force to a rear face of a substrate, and on the periphery of the radial through portions or cavity portions formed in the central portion of said mounting face is also provided attachment grooves following along the shape thereof.

10. An apparatus according to claim 8, wherein said radial mounting members comprise three spoke shape mounting portions arranged at approximately 120° when viewed within said mounting face, and said radial through portions or cavity portions of said mounting face are formed in approximately the same spoke shape such that said three spoke shape mounting portions can be accommodated with a predetermined clearance.

11. An apparatus according to claim 10, wherein in the case where said substrate is a circular substrate of diameter R, then a central point of a circle circumscribing said three spoke shaped through portions or cavity portions formed in said mounting face is made to approximately coincide with the center of the circular substrate, and the radius of the circumscribing circle is made 5~15% of said diameter R.

12. An apparatus according to claim 11, wherein at the perimeter of fan-shaped regions disposed between the peripheries of respective spoke parts of the three spoke shaped through portions or cavity portions and said circumscribing circle, is formed therealong attachment grooves for applying suction to the substrate rear face.

13. An apparatus according to claim 12, wherein in an interior side surrounded by the attachment grooves of said fan shaped region is formed a recess portion for opening to the atmosphere.

14. A substrate holding apparatus used with a substrate holder having a mounting face that is substantially the same shape as a substrate to be processed and which applies an attachment force between the mounting face and the substrate during processing of the substrate, for relatively protruding from a portion of said mounting face and supporting the substrate in an upper side space of said mounting face, when mounting a substrate on or removing a substrate from the mounting face, wherein a support portion which relatively protrudes from the portion of said mounting face for contacting with the rear face of the substrate is formed in a plurality of spokes so as to be accommodated without contact in radial through portions or cavity portions formed in the mounting face of said substrate holder.

15. An apparatus according to claim 14, wherein said multi-spoked support portion is fitted with a drive mechanism for vertical drive between a lower position where said multi-spoked support portion is accommodated in the radial through portions or cavity portions of said substrate holder, and the raised position where said multi-spoked support portion protrudes from the mounting face of said substrate holder.

16. An apparatus according to claim 14, wherein each of said plurality of spokes of the support portion, has an attachment recess or attachment hole for applying a suction force when a substrate rear face is contacted with an upper side face thereof.

17. An apparatus according to claim 16, wherein said attachment recesses formed in each of said plurality of spokes of the support portion are formed with their center portions mutually connected, and a region for applying an attachment force to a substrate rear face is made in the form of a plurality of spokes connected at their center.

18. An apparatus according to claim 14, wherein said plurality of spoke shaped support portions comprise three spokes extending from a central shaft portion and spaced at approximately 120° with distances L from the center approximately equal, and in the case where the substrate to be held is a circular substrate of diameter R, the respective distances L of said spoke shape support portions are made 5~15% of the diameter R.

19. A substrate processing apparatus on which is mounted the transport apparatus of claim 1 for exposure processing, measurement and inspection processing or treatment processing of a substrate.

* * * * *